(12) United States Patent
Cherukupalli

(10) Patent No.: US 11,502,642 B2
(45) Date of Patent: Nov. 15, 2022

(54) SYSTEMS, CIRCUITS AND METHODS FOR HARVESTING ENERGY FROM SOLAR CELLS

(71) Applicant: SAFUL CONSULTING, INC., Monte Sereno, CA (US)

(72) Inventor: Nagendra Srinivas Cherukupalli, Cupertino, CA (US)

(*) Notice: Subject to any disclaimer, the term of this patent is extended or adjusted under 35 U.S.C. 154(b) by 0 days.

(21) Appl. No.: 15/383,561

(22) Filed: Dec. 19, 2016

(65) Prior Publication Data

US 2017/0237395 A1 Aug. 17, 2017

Related U.S. Application Data

(63) Continuation of application No. 14/814,411, filed on Jul. 30, 2015, now abandoned.

(51) Int. Cl.
| | | |
|---|---|---|
| *H02S 50/10* | (2014.01) | |
| *H01L 31/02* | (2006.01) | |
| *H01L 31/05* | (2014.01) | |
| *H02S 50/00* | (2014.01) | |
| *H02S 40/34* | (2014.01) | |
| *G01R 19/165* | (2006.01) | |
| *H01L 31/049* | (2014.01) | |

(Continued)

(52) U.S. Cl.
CPC ........ *H02S 50/10* (2014.12); *G01R 19/16576* (2013.01); *G01R 31/26* (2013.01); *H01L 31/02021* (2013.01); *H01L 31/049* (2014.12); *H01L 31/0504* (2013.01); *H01L 31/0508* (2013.01); *H01L 31/0512* (2013.01); *H01L 31/0516* (2013.01); *H01L 31/1876* (2013.01); *H02S 30/10* (2014.12); *H02S 40/10* (2014.12); *H02S 40/32* (2014.12); *H02S 40/34* (2014.12); *H02S 40/36* (2014.12); *H02S 50/00* (2013.01); *Y02E 10/50* (2013.01); *Y10S 136/293* (2013.01); *Y10S 323/906* (2013.01); *Y10T 29/49002* (2015.01)

(58) Field of Classification Search
CPC ............. H01L 31/0504; H01L 31/0508; H01L 31/0516; H01L 31/042; H01L 31/02021; H02S 40/32; H02S 40/34; H02S 50/00; H02S 40/10; H02S 50/10
USPC .................................................. 136/243–265
See application file for complete search history.

(56) References Cited

U.S. PATENT DOCUMENTS

| | | |
|---|---|---|
| 3,636,539 A | 1/1972 | Gaddy |
| 3,696,286 A | 10/1972 | Ule |

(Continued)

OTHER PUBLICATIONS

U.S. Appl. No. 15/386,460, filed Dec. 21, 2016, Cherukupalli, Nagendra.

(Continued)

*Primary Examiner* — Andrew J Golden
(74) *Attorney, Agent, or Firm* — Barry Choobin; Patent 360LLC

(57) ABSTRACT

A solar power system may comprise a back sheet that comprises an interconnect circuit coupling a plurality of cell tiles. A tiled solar cell, comprising a solar cell and encapsulating and glass layers, is inserted into the cell tiles of the back sheet. Each solar cell is individually addressable through the use of the interconnect circuit. Moreover, the interconnect circuit of the back sheet is programmable and allows for dynamic interconnect routing between solar cells.

5 Claims, 24 Drawing Sheets

(51) Int. Cl.
- *H02S 40/10* (2014.01)
- *H02S 40/32* (2014.01)
- *G01R 31/26* (2020.01)
- *H01L 31/18* (2006.01)
- *H02S 30/10* (2014.01)
- *H02S 40/36* (2014.01)

(56) References Cited

U.S. PATENT DOCUMENTS

| | | |
|---|---|---|
| 4,175,249 A | 11/1979 | Gruber |
| 4,409,537 A | 10/1983 | Harris |
| 4,788,449 A | 11/1988 | Katz |
| 5,235,232 A | 8/1993 | Conley et al. |
| 5,380,371 A | 1/1995 | Murakami |
| 5,460,659 A | 10/1995 | Krut |
| 5,500,052 A | 3/1996 | Horiuchi et al. |
| 5,669,987 A | 9/1997 | Takehara et al. |
| 6,060,790 A | 5/2000 | Craig |
| 6,218,605 B1 | 4/2001 | Dally et al. |
| 6,350,944 B1 | 2/2002 | Sherif et al. |
| 6,448,489 B2 | 9/2002 | Kimura et al. |
| 6,686,533 B2 * | 2/2004 | Baum .............. H01L 31/02021 136/244 |
| 6,858,791 B2 | 2/2005 | Erban |
| 8,115,340 B2 | 2/2012 | Takehara et al. |
| 8,209,152 B2 | 6/2012 | Pershing |
| 2001/0023703 A1 | 9/2001 | Kondo et al. |
| 2003/0075211 A1 | 4/2003 | Makita et al. |
| 2003/0089899 A1 | 5/2003 | Lieber et al. |
| 2003/0201007 A1 | 10/2003 | Fraas |
| 2004/0118446 A1 | 6/2004 | Toyomura |
| 2005/0172996 A1 | 8/2005 | Hacke et al. |
| 2006/0162772 A1 | 7/2006 | Presher et al. |
| 2008/0121272 A1 | 5/2008 | Besser et al. |
| 2008/0142071 A1 | 6/2008 | Dorn et al. |
| 2008/0147335 A1 | 6/2008 | Adest et al. |
| 2008/0302408 A1 | 12/2008 | Bressler et al. |
| 2008/0306700 A1 * | 12/2008 | Kawam ............ H01L 31/02021 702/64 |
| 2009/0014050 A1 | 1/2009 | Haaf |
| 2009/0014057 A1 * | 1/2009 | Croft .................. H02S 50/00 136/248 |
| 2009/0266353 A1 | 10/2009 | Lee |
| 2010/0012172 A1 | 1/2010 | Meakin et al. |
| 2010/0043319 A1 | 2/2010 | Bennett |
| 2010/0117623 A1 | 5/2010 | Fife et al. |
| 2010/0186795 A1 * | 7/2010 | Gaul .................. H02S 40/34 136/244 |
| 2011/0108087 A1 | 5/2011 | Croft et al. |
| 2011/0220182 A1 | 9/2011 | Lin et al. |

OTHER PUBLICATIONS

U.S. Appl. No. 15/389,079, filed Dec. 22, 2016, Cherukupalli, Nagendra.
U.S. Appl. No. 12/969,391, filed Dec. 15, 2010, Cherukupalli.
U.S. Appl. No. 12/969,422, filed Dec. 15, 2010, Cherukupalli.
U.S. Appl. No. 12/969,432, filed Dec. 15, 2010, Cherukupalli.
U.S. Appl. No. 12/969,313, filed Dec. 15, 2010, Cherukupalli, et al.
U.S. Appl. No. 12/969,325, filed Dec. 15, 2010, Cherukupalli.
U.S. Appl. No. 12/969,340, filed Dec. 15, 2010, Cherukupalli.
U.S. Appl. No. 12/969,374, filed Dec. 15, 2010, Cherukupalli.
U.S. Appl. No. 12/969,353, filed Dec. 15, 2010, Cherukupalli.

* cited by examiner

US 11,502,642 B2

SYSTEMS, CIRCUITS AND METHODS FOR HARVESTING ENERGY FROM SOLAR CELLS

RELATED APPLICATION

This application claims benefit under 35 U.S.C. 120 to and is a continuation of the U.S. patent application entitled "AC CONVERSION ON THE SOLAR CELL LEVEL", having Ser. No. 14/814,411, filed on Jul. 30, 2015, which is expressly incorporated herein by reference in its entirety.

BACKGROUND OF THE INVENTION

Field of the Invention

The present invention is related to the field of solar power systems, and more specifically towards systems, circuits, and methods for a back sheet of an adaptive solar power system.

Art Background

Conventional solar modules are generally constructed by stringing together solar cells and then assembling the solar cells into a solar module that is typically encapsulated by ethylene vinyl acetate (EVA) and sandwiched between a glass sheet and a polyvinyl fluoride (TEDLAR) sheet. As such, a conventional solar module may comprise a packaged interconnected assembly of solar cells. Monitoring of a conventional solar power system is generally performed at the solar module level by measuring each solar module's generated output. As such, any reconfiguration of the conventional solar power system is conventionally implemented at the solar module level. The reconfiguration of solar modules may be used to address issues that result when there exists a partial covering of a solar module. The partial covering of the solar module results in the degradation of the operating performance of the solar module. Since the degraded solar module is typically in series with other solar modules to construct a solar module string, the degradation of one solar module would adversely impact the performance of the entire solar module string as the solar module string is typically limited by the weakest solar module.

Conventional reconfiguration techniques at the solar module level apply techniques for isolating each solar module from the solar module string by using a DC-De converter and then delivering the energy from the solar module. This results in each solar module operating independently. Typically, an external box is coupled to each solar module to control and implement the reconfiguration.

U.S. Pat. No. 6,350,944 discloses a reconfigurable solar panel system comprising a plurality of solar cells arranged in E predefined pattern on a printed circuit board that comprises a predefined pattern of interconnection paths to form at least one solar cell module. The solar panel is made of at least one solar cell module and has the capability to be configured and reconfigured by programming at least one integrated circuit that communicates with each and every solar cell on the solar module. The system of U.S. Pat. No. 6,350,944 is capable of monitoring, controlling, and protecting the solar panel, as well as being reconfigured before, during, and after the panel has been assembled. Moreover, U.S. Pat. No. 6,350,944 discloses a system for cell level monitoring of voltage measurements and cell level reconfigurability.

Although conventional techniques provide systems and methods to monitor and reconfigure solar modules, it would also be advantageous to monitor and reconfigure individual solar cells. The increased granularity of the monitoring and reconfiguring would allow for a more flexible and robust solar power system and provide means to harvest additional power. Additional techniques to implement a solar power system based on soar cells may eliminate the need for the conventional solar module packaging. As such, these techniques may additionally provide a more flexible and robust solar power system.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

The systems, methods, and circuits disclosed herein relate to an adaptive solar cell system. Specifically, the systems, methods, and circuits relate to solar cell monitoring and reconfiguring by means of tiles and programmable interconnects on a back sheet.

In the following detailed description, numerous specific details are set feral in order to provide a thorough understanding of the present invention. However, it will become obvious to those skilled in the art that the present invention may be practiced without these specific details. The description and representation herein are the common means used by those experienced or skilled in the art to most effectively convey the substance of their work to others skilled in the art. In other instances, well known methods, procedures, components, and circuitry have not been described in detail to avoid unnecessarily obscuring aspects of the present invention.

Figure 1:
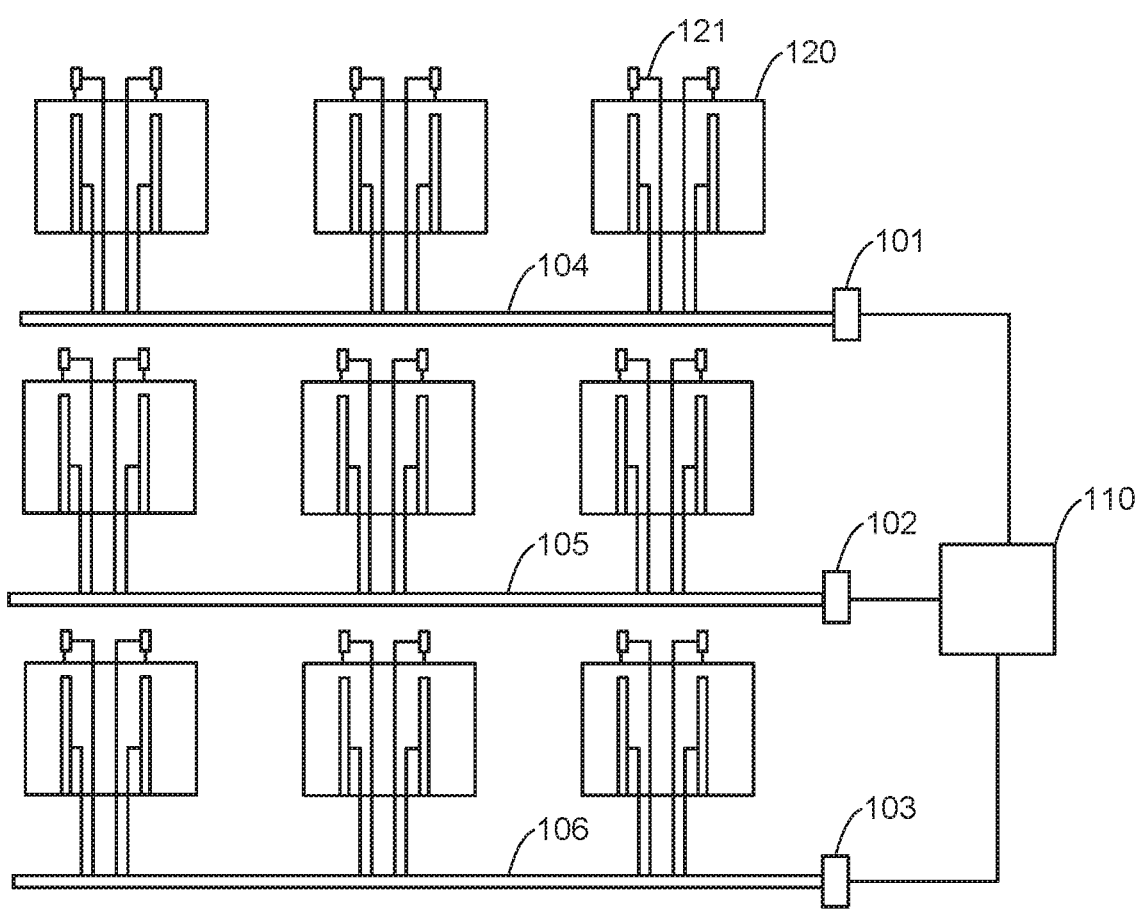
FIG. 1 illustrates a solar power system architecture comprising a string of solar cells.

FIG. 1 illustrates a solar power system architecture 100 comprising a string of solar cells. In general, the solar power system architecture 100 comprises a plurality of solar cells, traces from the solar cells, and a junction box coupled to the traces from the solar cells.

As seen in FIG. 1, the solar power system architecture 100 comprises a plurality of solar cells 120, traces 121, bus lines 104, 105, and 106, pins 101, 102, and 103, and a junction box 110. Each solar cell comprises at least one trace and each trace is coupled to a bus line. For example, solar cell 120 comprises a trace 121 that is coupled to bus line 104. Each bus line 104, 105, and 106 is coupled to a pin 101, 102, or 103. Each solar cell trace is subsequently accessible from the pins 101, 102, or 103 to a junction box 110.

Figure 2A:
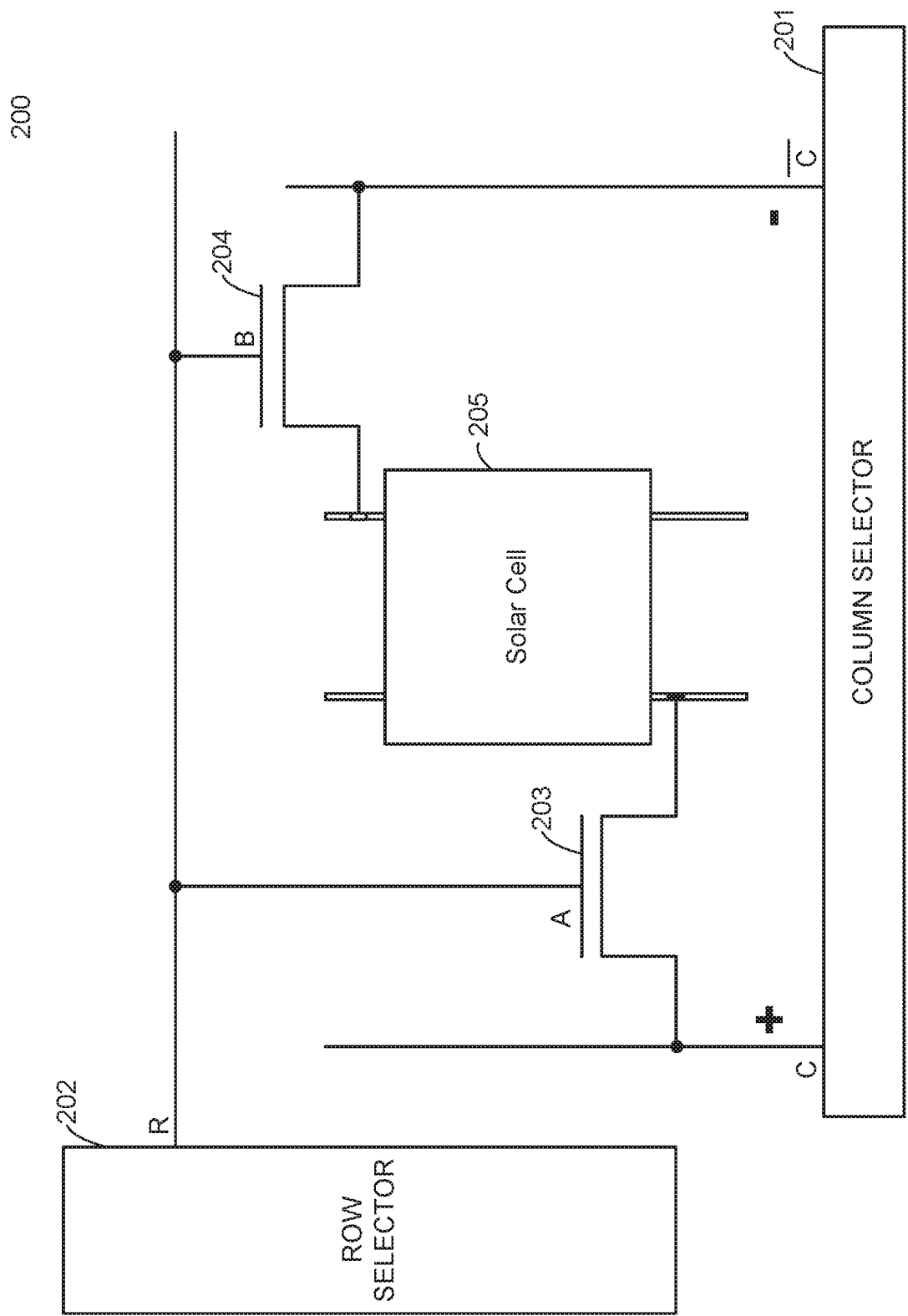
FIG. 2a illustrates an example of a solar cell architecture for monitoring the solar cell in accordance with some embodiments.

FIG. 2a illustrates a solar cell system architecture 200 for monitoring a solar cell. In general, the solar cell system architecture 200 comprises a solar cell that may be individually addressed and monitored.

Figure 2B:
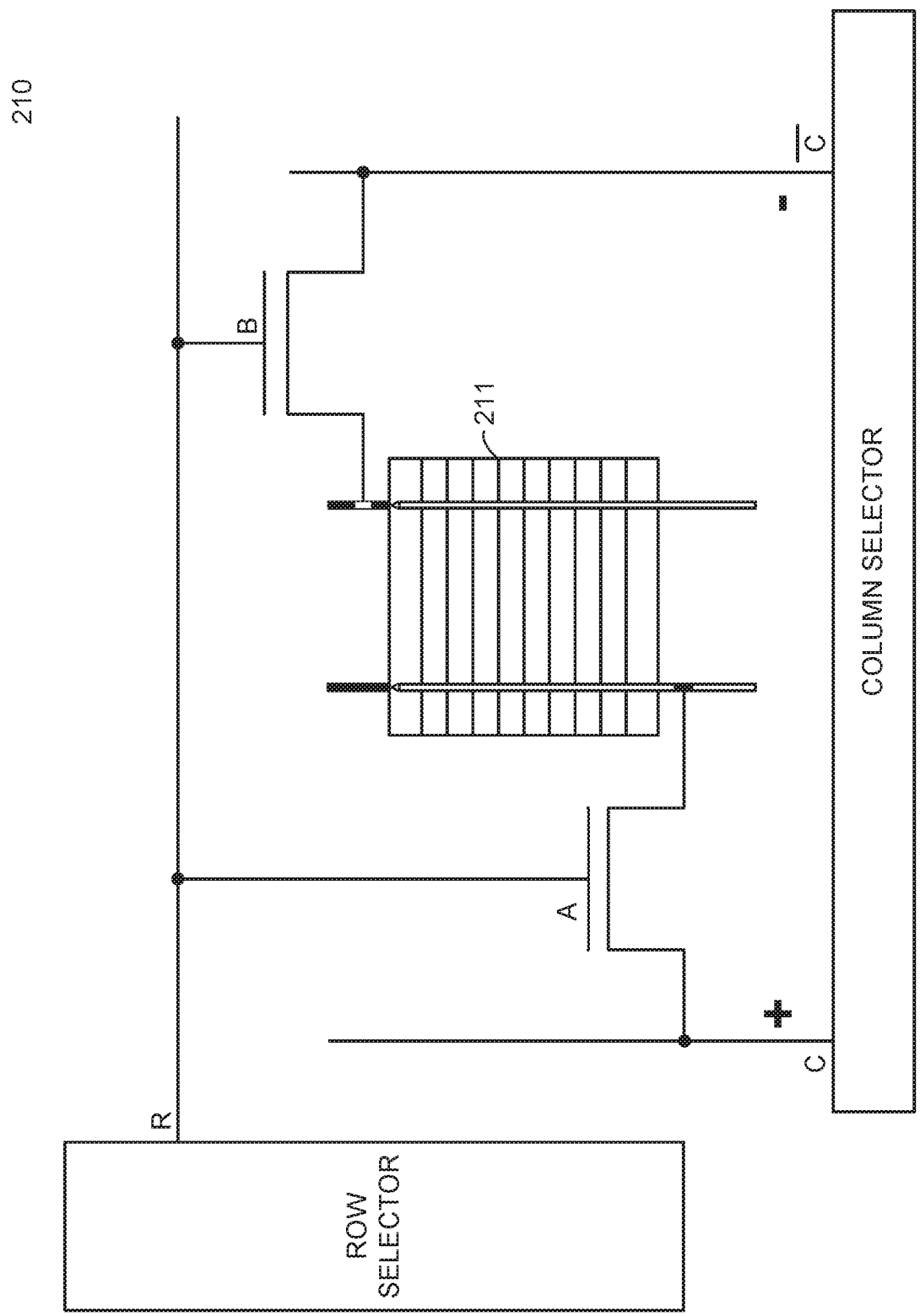
FIG. 2b illustrates an example of a solar cell architecture for monitoring another type of solar in accordance with some embodiments.

As seen in FIG. 2a, the solar cell system architecture 200 comprises a solar cell 205. In some embodiments, the solar cell 205 comprises a conventional solar cell. In the same or alternative embodiments, the solar cell 205 may comprise a back contact solar cell. For example, FIG. 2b illustrates a solar cell system architecture 210 comprising a conventional solar cell 211. As such, the monitoring and reconfiguring of a solar cell 205 may not depend on the type of solar cell 205 that is implemented in the solar cell system architecture 200. In some embodiments, the solar cell system architecture 200 comprises a column selector 201, row selector 202, and metal oxide semiconductor field-effect transistors (MOSFETs) 203 and 204. The row selector 202 may be coupled to the gates of each of the MOSFETs 203 and 204 while the column selector 201 may be coupled to the source or drain of each of the MOSFETs 203 and 204.

In operation, some embodiments of the solar cell system architecture 200 of FIG. 2a comprise a row selector 202 and a column selector 201. The row selector 202 may be configured for enabling a solar cell. For example, if the row selector 202 enables the solar cell 205, then the MOSFETs 203 and 204 are also enabled. Next, the column selector 201 may be configured to measure the concur and/or the voltage across the solar cell. As such, the MOSFETs 203 and 204 enable a voltage measurement to be taken across the solar cell 205.

Figure 3:
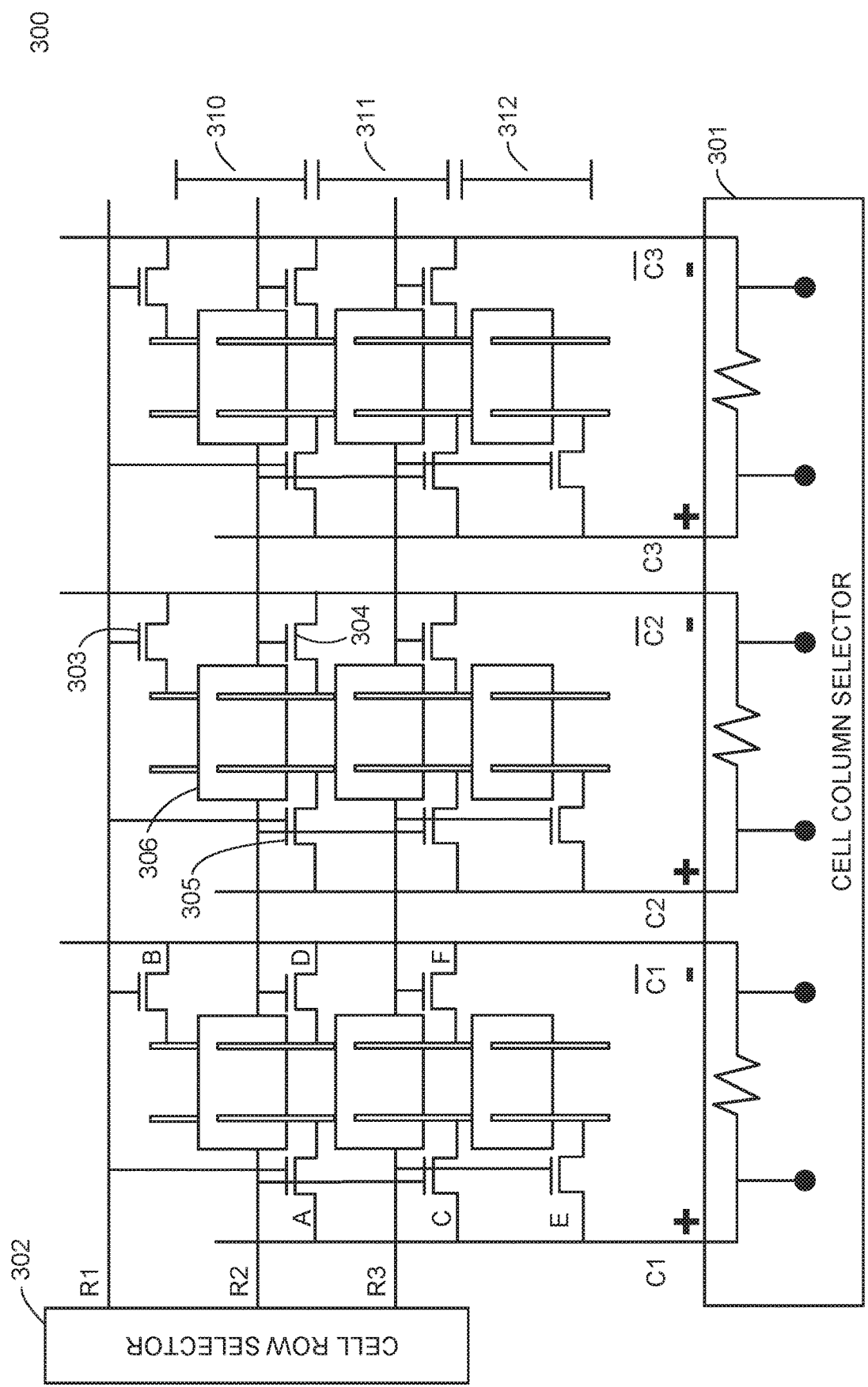
FIG. 3 illustrates an example system architecture of a matrix of individually monitored solar cells.

FIG. 3 illustrates an example of an architecture of a matrix 300 of individually monitored solar cells. In general, the matrix 300 comprises a plurality of solar cells 306 and associated traces arranged in rows and columns. Each of the solar cells 306 within the matrix 300 may be individually monitored through the use of the row selector 302 and column selector 3C 1.

As seen in FIG. 3, the matrix 300 comprises a plurality of solar cells 306. Each solar cell 306 may be coupled to a plurality of MOSFETs 303, 304, and 305. The matrix 300 further comprises a row selector 302 and a column selector 301. Each solar cell 306 may be coupled to MOSFETs (or switches) 303, 304, and 305 that may be enabled for sampling of the solar cell's voltage and/or current. In some embodiments, a row selector may enable a set of solar cells 306 connected to one row. For example, the row selector 302 may enable MOSFETs 303, 304, and 305 of each solar cell 306 of solar cell row 310. In this instance, solar cells of solar cell rows 311 and 312 would not be enabled. Next, the column selector 301 may measure voltages and/or currents for each of the enabled solar cells from solar cell row 310. In some embodiments, the column selector 301 may implement a clocking scheme for walking through each solar cell of a selected solar cell row 310, measuring the voltage and/or current of each solar cell, and then transmitting the voltage and/or current data and/or solar cell address to a processing unit, as discussed below.

In some embodiments, the above disclosed monitoring functions are performed by a monitoring, circuit. For example, the monitoring circuit may comprise a sampling circuit for sampling voltage levels at the solar cells 306. In some embodiments, the sampling of the voltage levels may be performed as a function of time with a certain periodicity and interval time between sampling periods. For example, the monitoring circuit may control sampling of solar cells 306 so that the solar cells 306 are sampled at least twice per day. In some embodiments, the monitoring circuit may comprise a tuned sampling accuracy for a specific monitoring application.

As such, the matrix 300 of FIG. 3 comprises a plurality of solar cells that may comprise conventional solar cells and/or back contact solar cells. Row selectors may enable a row of solar cells and a column selector may step through and monitor the voltage and current of each solar cell enabled in a selected row.

Figure 4:
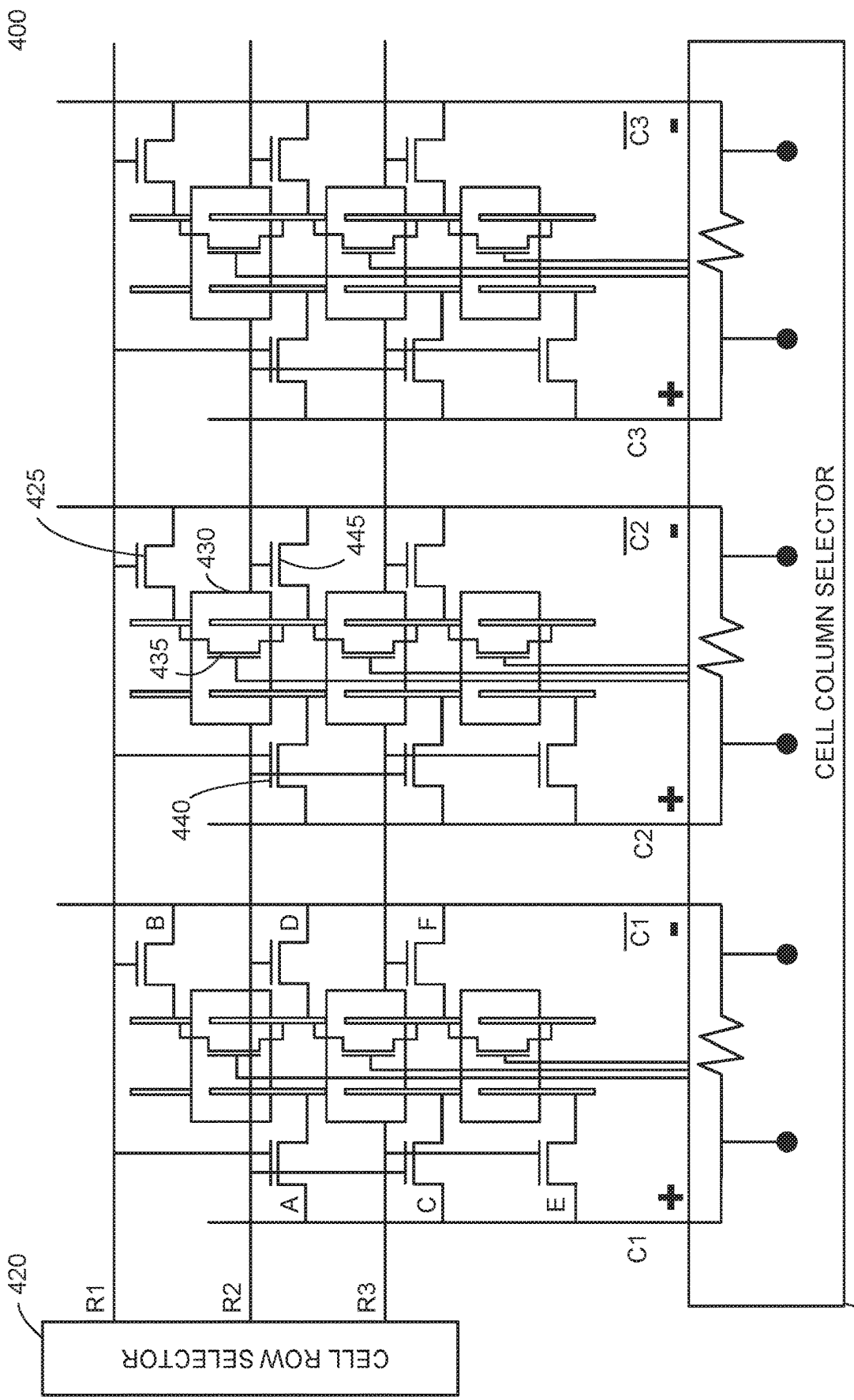
FIG. 4 illustrates an example system architecture for cell monitoring and cell bypassing in accordance with some embodiments.

FIG. 4 illustrates an example of a solar cell matrix 400 capable of monitoring and/or bypassing solar cells. In general, the solar cell matrix architecture 400 comprises a plurality of solar cells. Each solar cell is capable of being individually addressed and monitored as well as capable of being individually bypassed. In some embodiments, the ability of the solar cell matrix 400 to output energy is limited by the weakest solar cell comprised within the solar cell matrix 400. As such, in some embodiments, a solar cell may be bypassed when the performance of the solar cell is out of specification. Thus, the bypassing of the solar cell may allow a more optimal performance for the solar cell matrix 400.

This type of approach may be termed "harvesting by cell exclusion" as specific solar cells may be bypassed and isolated from other solar cells within the solar cell matrix 400.

As seen in FIG. 4, the solar cell matrix 400 comprises a plurality of solar cells 430 arranged in rows and columns, row selector 420, and column selector 410. The solar cell matrix 400 further comprises a plurality of MOSFETs or switches coupled to each solar cell 430. MOSFETs 425, 440, and 445 are implemented so as to allow for the monitoring of each individual solar cell 430, as discussed with relation to FIG. 3. As such, the row selector 420 may select a row of solar cells and enable the solar cells within the row and the column selector 410 may step through and monitor the voltage and current of each solar cell enabled in a selected row. Solar cell matrix 400 comprises an additional MOSFET (or switch) 435 for purposes of bypassing a solar cell. In some embodiments, the MOSFET 435 is placed across the solar cell 430. In other embodiments, the MOSFET 435 is comprised within the solar cell 435. As such, in the solar cell matrix 400, each solar cell may comprise a MOSFET 435 placed across each individual solar cell. The MOSFET 435 may be used to bypass the solar cell 430 such that the energy output from the solar cell 430 is not collected.

In some embodiments, the solar cell matrix 400 of FIG. 4 may temporarily enable a bypass switch or MOSFET 435. For example, one solar cell 430 may be partially shaded or covered by debris. Enabling the bypass switch or MOSFET 435 of the partially shaded or covered solar cell 430 may allow the solar cell matrix 400 to operate a higher performance since the overall solar cell matrix 400 is no longer limited by the partially shaded or covered solar cell 430. In some embodiments, once the solar cell 430 is no longer partially shaded or covered so that the solar cell does not limit or degrade the overall performance of the solar cell matrix 400, the bypass switch or MOSFET 435 may be disabled so that the solar cell 430 is no longer bypassed.

In some embodiments, a two terminal device such as a diode may be implemented in place of the bypass switch or MOSFET 435. However, in some embodiments, control of the diode from an external module or control system may be difficult.

Figure 5B:
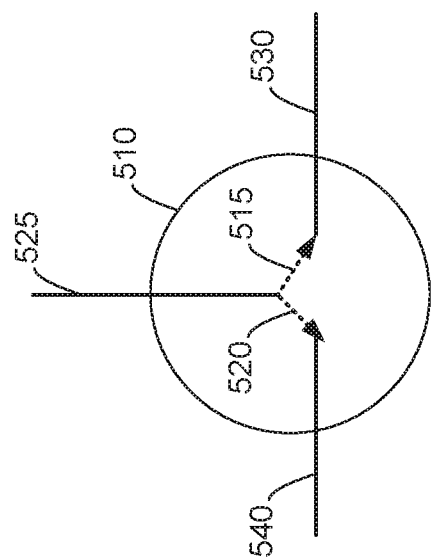
FIG. 5b illustrates a programmable switch used in some embodiments of the present invention.
Figure 5C:
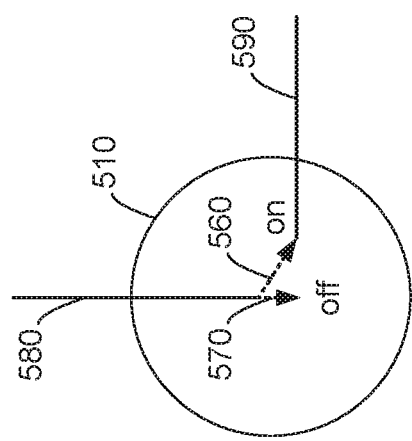
FIG. 5c illustrates the operation of an example programmable switch used in some embodiments of the present invention.
Figure 5A:
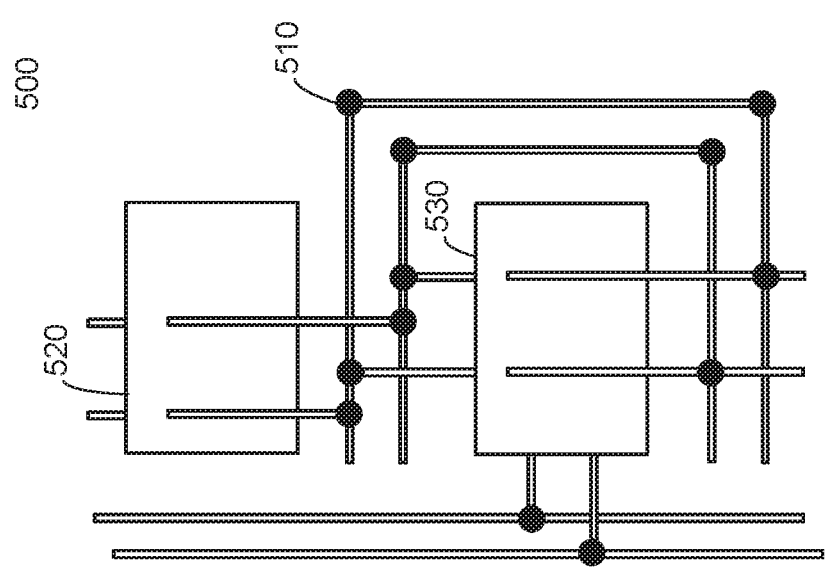
FIG. 5a illustrates an example embodiment of switch fabric used in some embodiments of the system architecture.

FIG. 5a illustrates programmable interconnect fabric 500 used in some embodiments of the solar cell matrix architecture that has been described above. In general, the programmable interconnect fabric 500 comprises at least one programmable switch that may be used to reroute and capture the energy that has been produced by a solar cell that has been bypassed.

As seen in FIG. 5a, the programmable interconnect fabric 500 connects a plurality of solar cells. For example, the programmable interconnect fabric 500 connects a solar cell 520 with a solar cell 530. Moreover, the programmable interconnect fabric 500 comprises at least one programmable switch 510 that may be used to route energy produced by the solar cells.

FIG. 5b illustrates a programmable switch 510 that may be used in some embodiments of the programmable interconnect fabric 500. As illustrated, the switch 510 comprises a state 520 and a state 515. The switch 510 may be programmed to be placed in a state 520 and thus couple the routing segment 525 to the routing segment 540. Alternatively, the switch 510 may be placed in a state 515 and thus couple the routing segment 525 to the routing segment 530.

FIG. 5c illustrates another embodiment of a programable switch 510 that may be used in the programmable interconnect fabric 500. As illustrated, the switch 510 comprises a routing segment 580, routing segment 590, and states 560 and 570. The switch 510 may be programmed to be placed in a state 560, which would couple routing segment 580 to routing L) segment 590 and thus allow energy or current to flow from routing segment 580 to routing segment 590. In some embodiments, this would be described as an "on" state for the switch 510. Alternatively, the switch 510 may be placed in an "off" state 570. In an "off" state 570, the routing segment 580 is not coupled to the routing segment 590. As such, in an "off" state 570, current or energy does not flow from the routing segment 580 to the routing segment 590.

As a result, the programmable switches may be used to route current through the programmable interconnect fabric 500 and to couple at least one solar cell to another solar cell. As such, the programmable interconnect fabric 500 comprising programmable switches 510 may be implemented to control the current flow from a solar cell. In some embodiments, the programmable interconnect fabric 500 may be configured so as to allow a series connection from a solar cell to a neighboring solar cell. As such, the programmable interconnect fabric 500 may be programmed to achieve a standard solar cell string connection. In some embodiments, the programmable interconnect fabric 500 may be configured so as to bypass a solar cell that is performing out of specification. As such, the programmable interconnect fabric 500 may perform an exclusion connection of a solar cell within a solar cell matrix. In some embodiments, the programmable interconnect fabric 500 may further be programmed to reroute current or energy from a bypassed solar cell to a parallel bus route as discussed in further detail below. In some embodiments, multiple bypassed cells may be configured to be connected in series. In the same or alternative embodiments, the parallel bus route(s) may be combined to another bus route in order to integrate the outputs.

Figure 6:
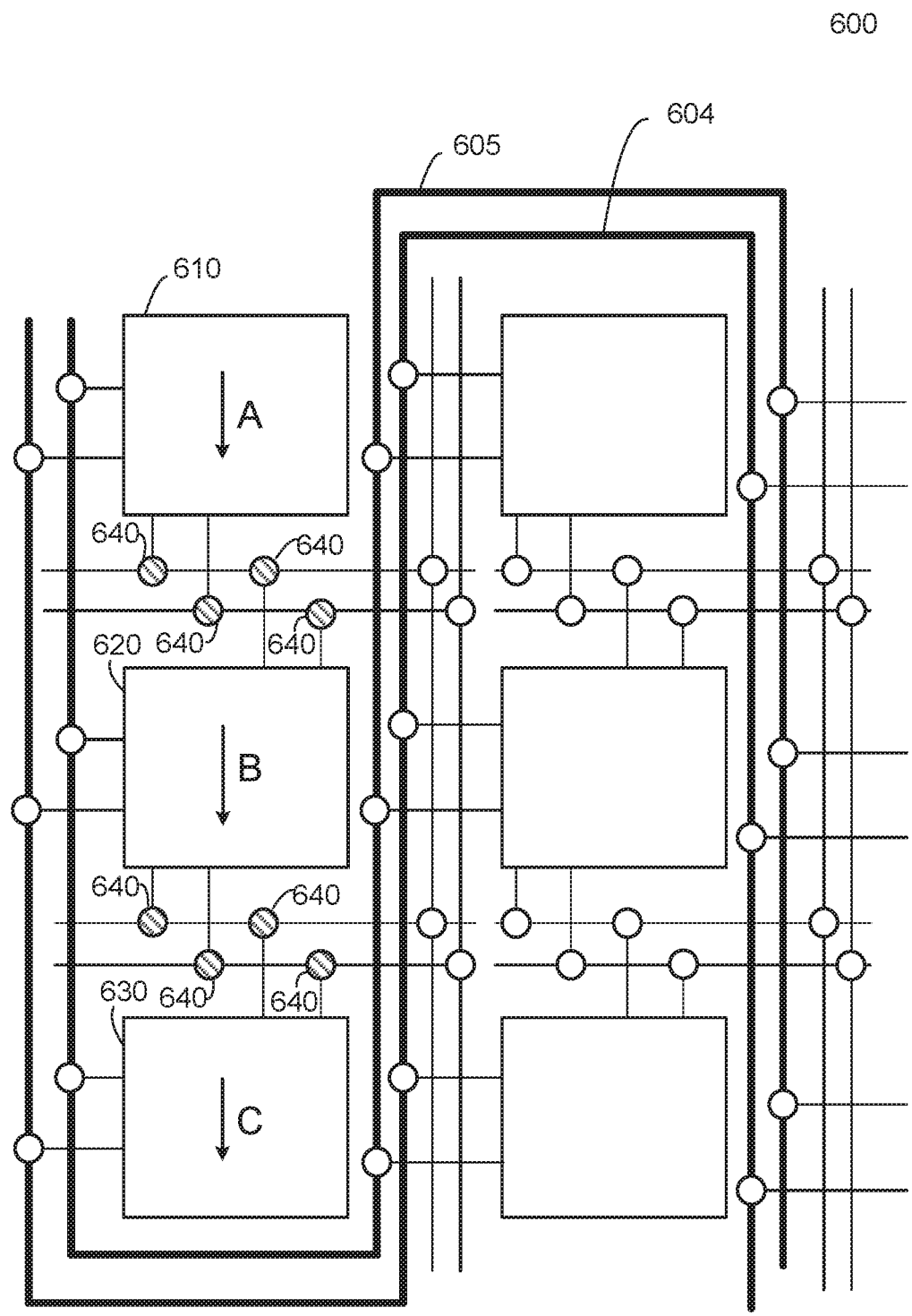
FIG. 6 illustrates an example embodiment of switch fabric configured to allow a series connection between solar cells.

FIG. 6 illustrates an example embodiment of a configuration 600 of programmable interconnect fabric to allow a series connection between solar cells in a solar cell matrix. As illustrated, a solar cell matrix comprises a plurality of solar cells 610, 620, and 630. The programmable interconnect fabric comprises a bus 604, parallel bus 605 and a plurality of programmable switches. In this embodiment, programmable switches 640 are enabled so as to allow a series current to flow between solar cells 610, 620, and 630. As a result, there is no bypassing of a solar cell 610, 620, or 630 and current from each of the solar cells 610, 620, and 630 is flowing in series.

Figure 7:
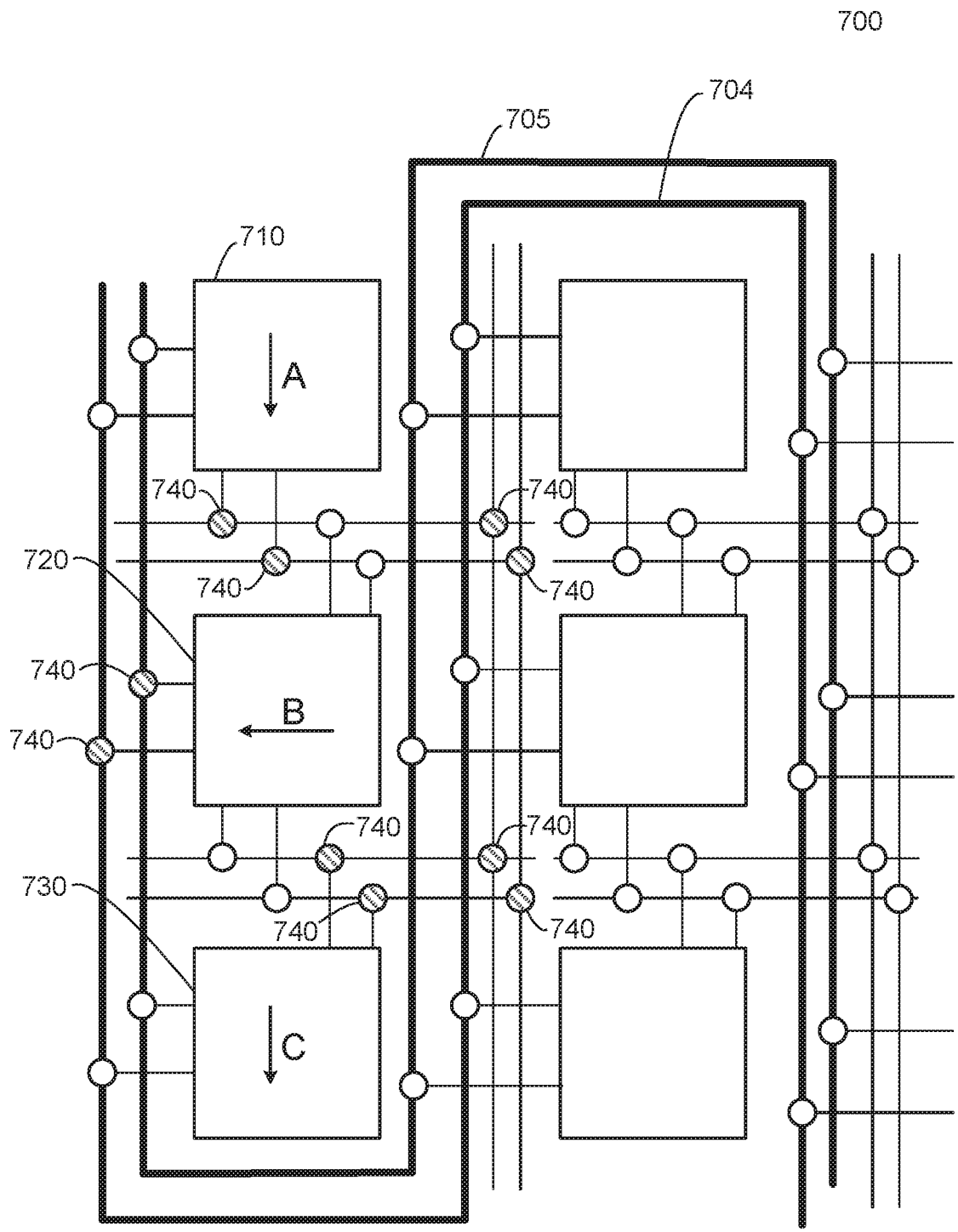
FIG. 7 illustrates an example embodiment of switch fabric configured to exclude a solar cell from a series connection between solar cells.

FIG. 7 illustrates an example embodiment of a configuration 700 of programmable interconnect fabric configured to bypass a solar cell and reroute the bypassed solar cell output to a parallel bus. As illustrated, a solar cell matrix may, in some embodiments, comprise solar cells 710, 720, and 730. The programmable interconnect fabric may comprise a bus 704, parallel bus 705, and a plurality of switches. In this embodiment, the programmable switches 740 are enabled so as to allow the current from solar cell 710 and the current from solar cell 730 to flow together in series. In some embodiments, the series current from these solar cells is routed through bus 704. However, solar cell 720 has been bypassed. Although solar cell 720 has been bypassed, it may still be capable of producing a current. As such, the output current from bypassed solar cell 720 is routed to parallel bus 705. Thus, energy is collected from each of the solar cells 71C, 720, and 730. In some embodiments, outputs from each bus or parallel bus line may be combined.

Figure 8:
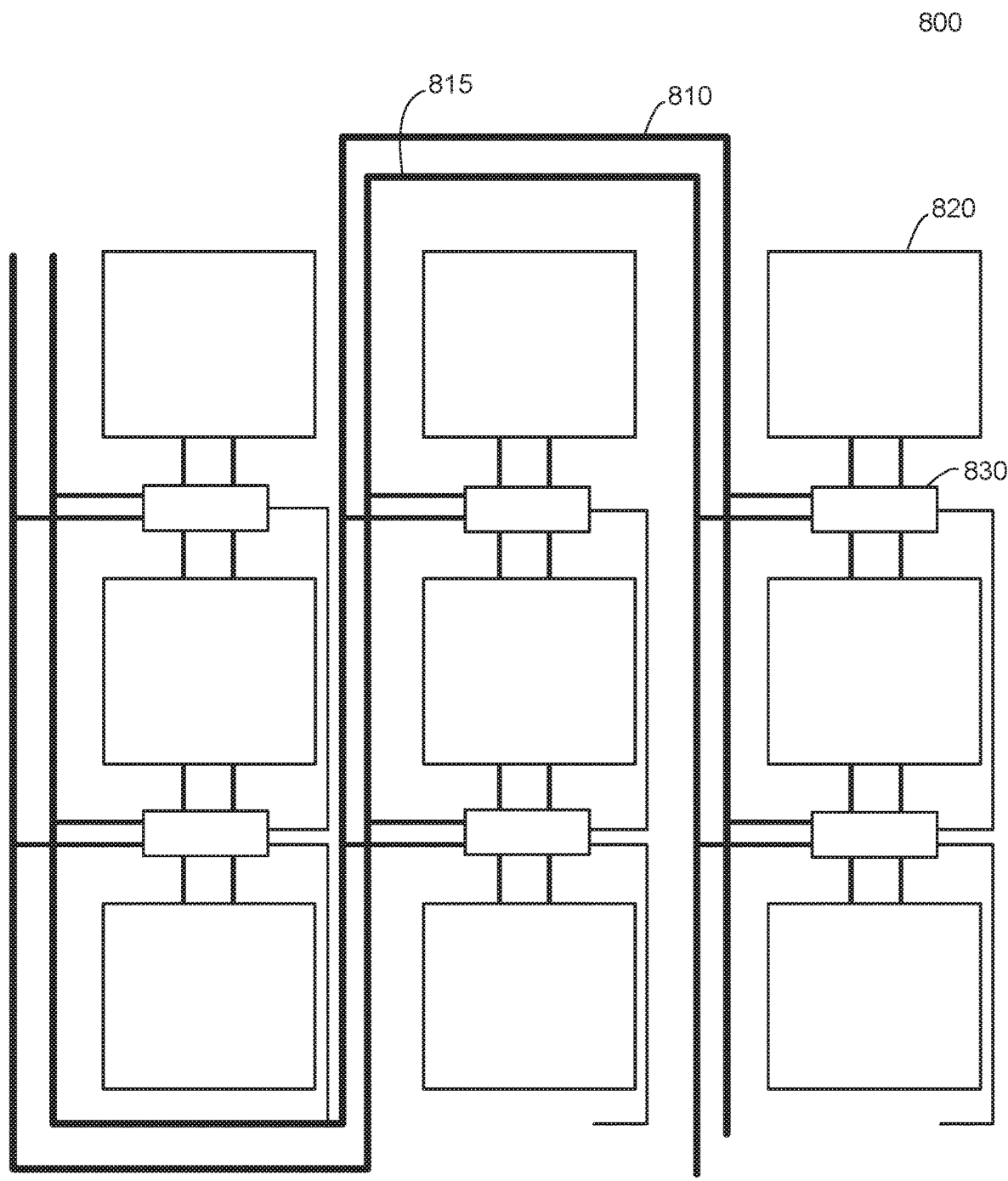
FIG. 8 illustrates an example embodiment of the solar power system architecture comprising programmable interconnect chips.

FIG. 8 illustrates an example embodiment of a solar cell matrix 800 with programmable interconnect fabric that comprises at least one embedded programmable chip. As illustrated, the solar cell matrix 800 comprises a plurality of solar cells 820, at least one embedded programmable interconnect chip 830, parallel bus 810, and bus 815. In some embodiments, the embedded programmable interconnect chip 830 determines the routing of current between solar cells 820 and through the programmable interconnect fabric. In some embodiments, the embedded programmable interconnect chip 830 comprises at least the functionality of the switches described with relation to FIGS. 5b and 5c.

In some embodiments, the embedded programmable interconnect chip 830 may comprise the routing functionality to allow a series connection through solar cells, bypass a solar cell, and/or bypass a solar cell and re-mute the energy from the bypassed solar cell to parallel bus 810. Although the embedded programmable interconnect chip is illustrated as being a part of the programmable interconnect fabric, in some embodiments the embedded programmable interconnect chip 830 may be integrated onto each solar cell 820. As such, in some embodiments, the embedded programmable interconnect chip 830 may be fabricated onto the solar cell 820. This may result in the elimination of separate discrete devices, such as the embedded programmable interconnect chip 830, from being integrated into the programmable interconnect fabric.

Figure 9:
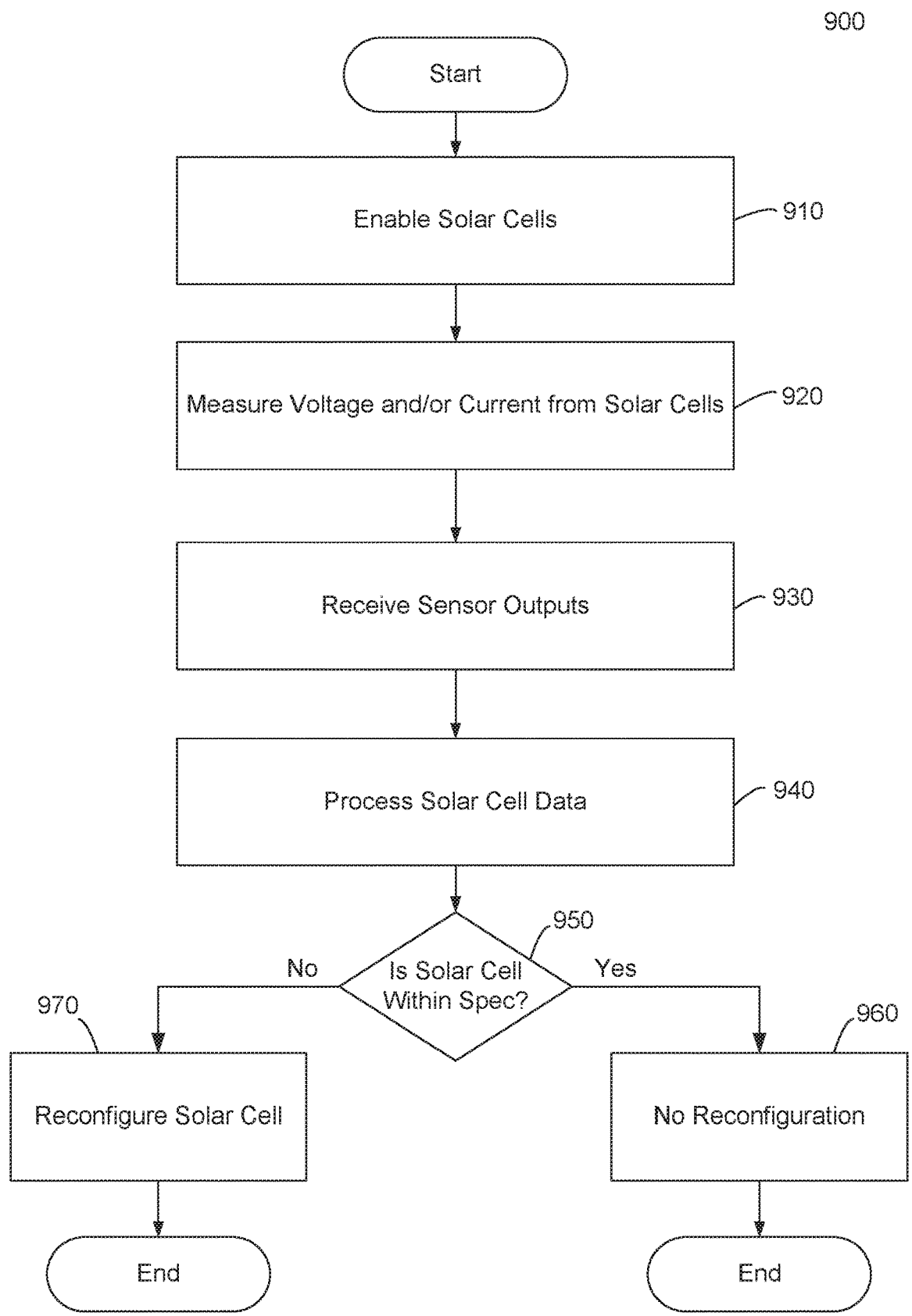
FIG. 9 illustrates a flow diagram for a method of monitoring and reconfiguring a solar cell.

FIG. 9 is a flow diagram for the monitoring and reconfiguration of a solar cell in accordance with some embodiments. In general, each solar cell of a solar cell matrix may be monitored and reconfigured. At block 910, at least one solar cell is enabled. In some embodiments, the solar cells are arranged in rows and columns so as to comprise a solar cell matrix. In this embodiment, a row selector module may enable a row of solar cells such that every solar cell within the row is enabled. In some embodiments, an individual solar cell of a plurality of solar cells within a single row of a solar cell matrix may be enabled. At block 920, measurements of each enabled solar cell are taken and received. In some embodiments, the measurements comprise a solar cell's voltage and/or current output. In the same or alternative embodiments, a column selector module implements a clocking scheme to measure pairs of solar cell voltages across a precision resistor in order to measure the voltage output of a solar cell. Thus, in some embodiments, a solar cell voltage may be used as a proxy for the energy that is being generated by the solar cell. At block 930, an output of at least one sensor may be received. In some embodiments, the sensor may be comprised within the back sheet. In the same or alternative embodiments, the sensor may be comprised within the solar cell. In other embodiments, the sensor may be comprised within a control system module. The sensor output may indicate the ambient conditions within a solar cell or within an area of the back sheet. In some embodiments, a sensor may measure or record conditions such as, but not limited to, temperature, humidity, and irradiance.

At block 940, the measurements from block 920 and the sensor outputs from block 930 may be processed. In some embodiments, the data with regard to each enabled solar cell's voltage and sensor outputs may be logged with a timestamp. The data may then be algorithmically processed to determine whether the cell is performing within certain specifications. At block 950, a determination is made whether the solar cell is within specification. If the solar cell is within specification then, at block 960, no reconfiguration is performed and the method ends. If the solar cell is not within specifications then, at block 970, the solar cell may be reconfigured. In some embodiments, the solar cell is reconfigured by excluding or bypassing the solar cell from other cells in the solar cell matrix. In this embodiment, the output from the bypassed solar cell may be routed to a parallel bus so that the energy from the bypassed solar cell is harvested without impacting the other solar cells that are within the specifications.

Figure 10:
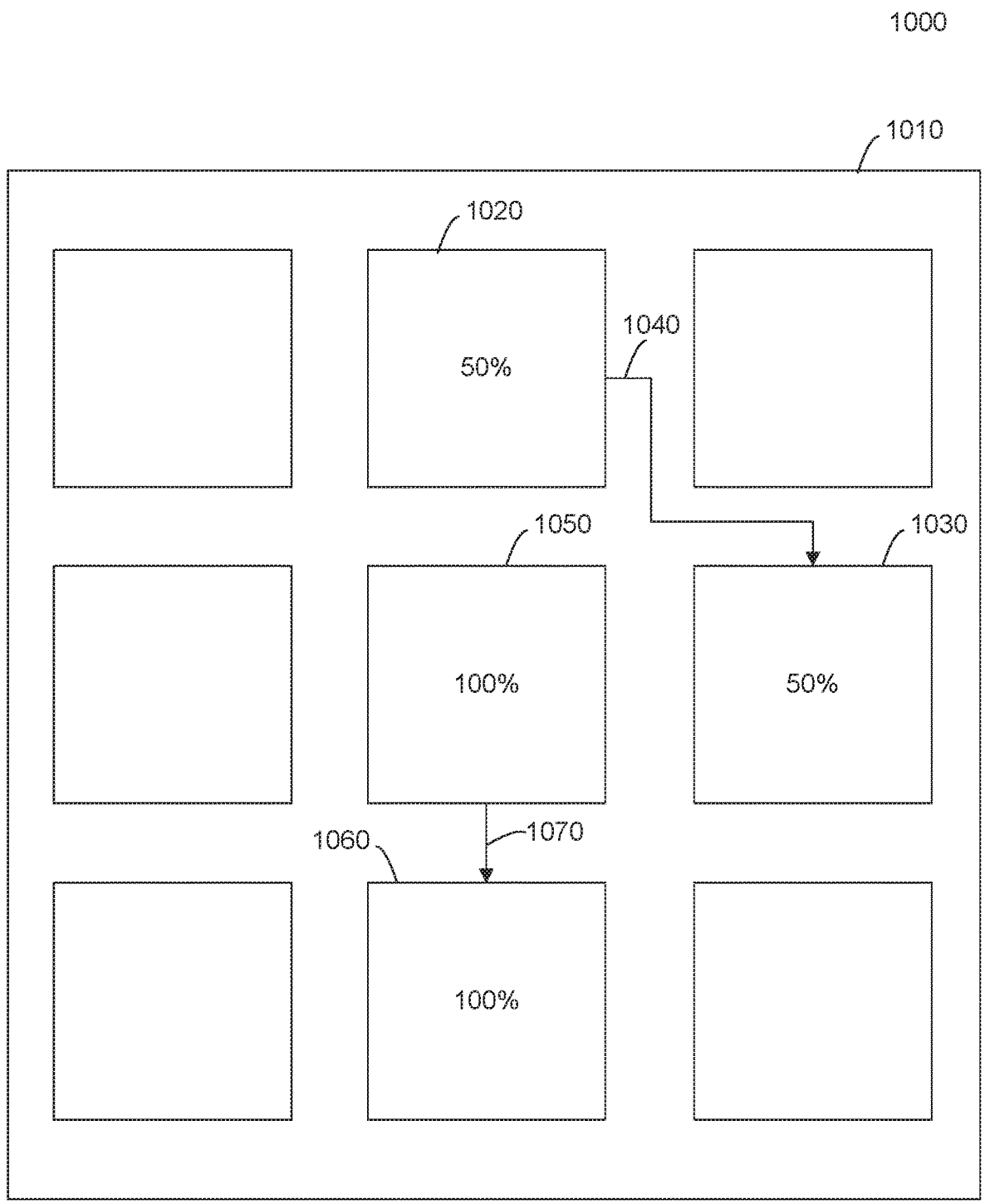
FIG. 10 illustrates an example embodiment of a reconfiguration of solar cells in order to maximize energy output.

FIG. 10 illustrates an example embodiment of a reconfiguration 1000 of solar cells in a solar cell matrix in order to maximize energy output. As described earlier, a solar cell may be in series with other solar cells to construct a solar cell string. This is due to charge sharing among solar cells where a solar cell generating more energy transfers energy to a neighboring cell that is generating a lesser amount of energy. As such, the amount of energy driving the output load of the solar cell string is reduced. Thus, the degradation of one solar cell of a solar cell string may adversely impact the performance of the entire solar string as the solar cell string is typically limited by the weakest solar cell in the string.

As illustrated in FIG. 10, a back sheet 1010 comprises solar cells 1020, 1030, 1050, and 1060. Solar cells 1050 and 1060 comprise a 100% output. However, solar cells 1020 and 1030 have degraded and may comprise a 50% output. As such, if a solar string comprised solar cells 1020 and 1030 with a 50% output and the solar cells 1050 and 1060 with a 100% output, then the solar cell string would be limited or reduced by the 50% output of the solar cells 1070 and 1030. As such, in some embodiments, the programmable interconnect fabric is configured so that degraded solar cells are in series with other degraded cells and fully functioning solar cells are connected in series with other fully functioning solar cells. For example, solar cell 1020 and solar cell 1030, each with a 50% output, are connected in series by programmable interconnect fabric route 1040. As such, solar cell 1020 and solar cell 1030 comprise a solar cell string. However, solar cell 1050 and solar cell 1060, each with a 100% output, are comprised in a separate solar cell string. For example, solar cell 1050 is connected in series with solar cell 1060 by programmable interconnect route 1070. As a result, FIG. 10 illustrates two solar cell strings implemented in a single back sheet, each solar cell string comprising solar cells of similar output efficiency. As a result, the solar cell strings will not display output energy loss due to solar cell mismatches.

Although the above illustration and description shows the reconfiguration of four solar cells to construct two solar cell strings, it should be appreciated that any number of solar cells may be reconfigured to create any number of solar cell strings.

Figure 11:
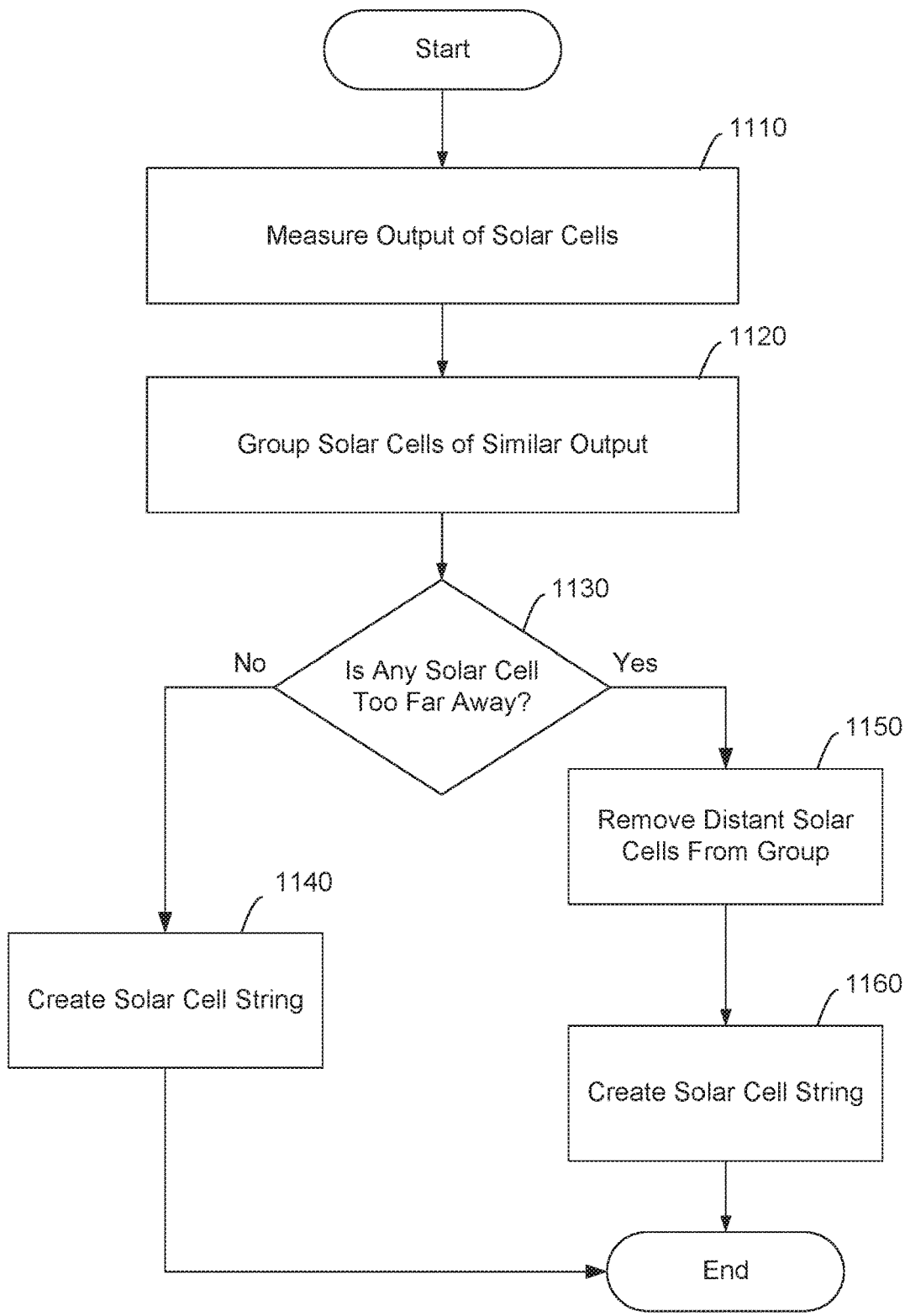
FIG. 11 is a flow diagram of a method for reconfiguring the solar cells and programmable interconnect fabric to group solar cells of similar output efficiency into solar cell strings.

FIG. 11 illustrates a flow diagram of a method 1100 for reconfiguring the solar cells and programmable interconnect fabric to group solar cells of similar output into solar cell strings. In general, the method 1100 reconfigures solar cells and programmable interconnect fabric so that solar cells of similar output may be connected in series to construct a solar string.

As illustrated in FIG. 11, at block 1110, the output of solar cells is measured. For example, solar cells may be measured to determine those solar cells that are operating within a defined specification and those solar cells that are operating out of a defined specification. For example, as solar cells age, each solar cell may age differently. Thus, a measured current-voltage (IV) curve or characteristic of the solar cells will diverge. At block 1120, the solar cells may be categorized into groups of solar cells of a similar output. For example, if a back sheet comprises two solar cells operating at a 100% output and three solar cells operating at a 50% output, then the two solar cells operating at a 100% output may be categorized into a first group of solar cells and the three solar cells operating at a 50% output may be categorized into a second group of solar cells. At block 1130, the solar cells in each group are evaluated with respect to each other solar cell in the group to determine if an of the solar groups are located in a position of the back sheet such that the distance between solar cells creates energy inefficiencies. For example, if one of the solar cells of the second group comprising the three solar cells at a 50% output is located at a significant distance from the other two solar cells at a 50% output, then the distance between the solar cells may create energy inefficiencies due to the longer required interconnect path between the solar cells. As such, in some embodiments, solar cells that are determined to be of longer distance to other solar cells may be removed from a grouping of solar cells. As such, the solar cell that is too distant from the other solar cells will not be comprised within the solar string comprising the other cells of similar output.

As seen in FIG. 11, at block 1130, a determination is made whether a solar cell is too distant from other solar cells within a grouping. If the solar cell is not too distant, then at block 1140, a solar cell string is created. In some embodiments, the solar cell string is created by reconfiguring solar cells and the programmable interconnect fabric such that the solar cells are connected in series with each other. However, if the solar cell is too distant from the other solar cells within a grouping of solar cells, then the distant solar cell will be removed from the grouping. Then, at block 1160, a solar cell string is created for the remaining solar cells. As such, in some embodiments, the solar cell string is similarly created by reconfiguring solar cells and the programmable interconnect fabric such that the solar cells are connected in series with each other.

As a result, the method 1100 of FIG. 11 provides for the discrimination of solar cells based on the solar cell output efficiency. In some embodiments, the solar cells are discriminated based upon IV performance and spatial positioning of solar cells. In some embodiments, every solar cell's output is measured. The solar cells may then be grouped according to output measurements. In some embodiments, a deviation from a specification may be specified. For example, solar cells that deviate 0.1% to 2% from a specified output level may be grouped into a first solar cell string and solar cells that deviate 2% to 3% from the specified output level may be grouped into a second solar cell string. In some embodiments, distance between solar cells may be used to exclude a solar cell from a solar cell string. For example, if a group contains solar cells that deviate 1% to 3% from a specified output level are grouped, any solar cells that are at a defined distance or a distance calculated to create an energy inefficiency or loss due to interconnect length between solar cells may be excluded from the group. As such, the distant solar cell may be comprised within a separate solar cell string. In some embodiments, solar cells may be grouped by geographic location within a solar cell matrix and then solar cells of similar output within one geographic location may be grouped into a solar cell string. In some embodiments, a model may be used to determine whether to include solar cells into a solar cell string. In some embodiments, the solar cell strings may be created so as to meet a voltage specification, as discussed in more detail below.

Figure 12:
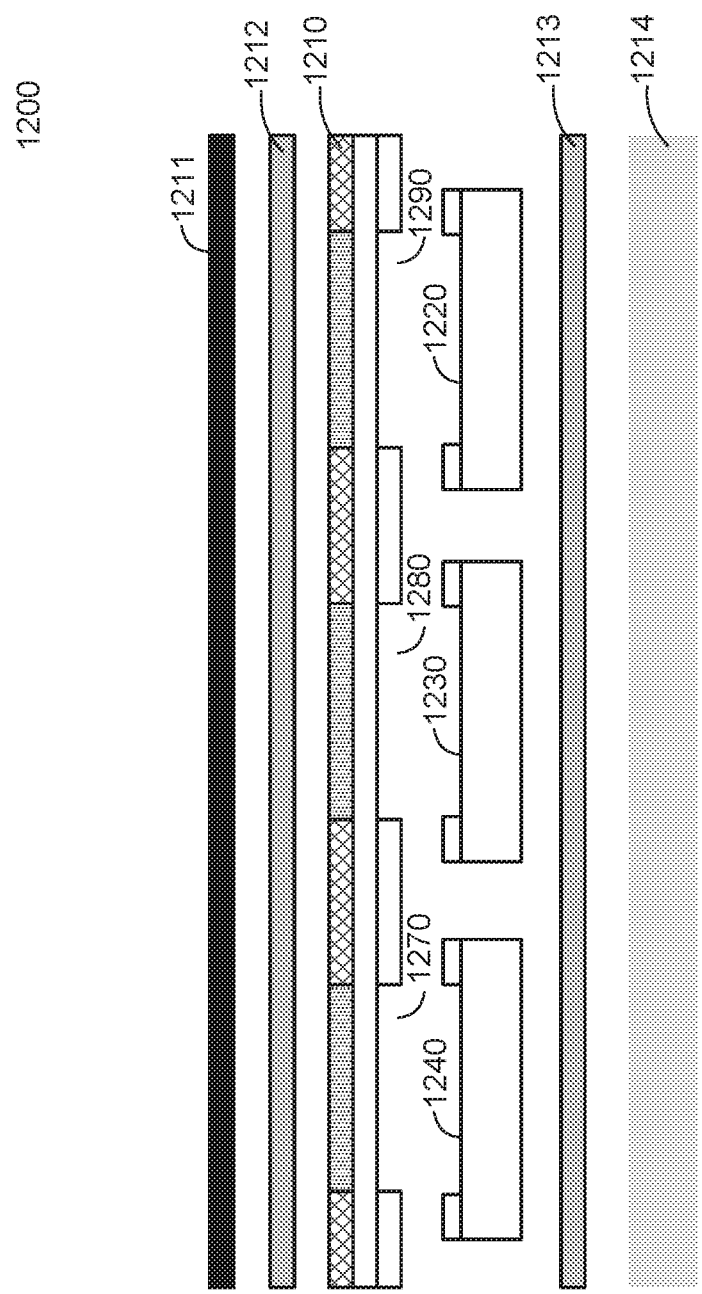
FIG. 12 illustrates an example embodiment of a back sheet integration used in accordance with some embodiments.

FIG. 12 illustrates an example embodiment of a back sheet integration 1200 used in accordance with some embodiments. In general, the back sheet integration 1200 comprises a back sheet 1210 and tiled solar cells 1220, 1230, and 1240. In some embodiments, the back sheet 1210 comprises a current carrying grid, programmable interconnect fabric, and programmable switches. The tiled solar cells 1220, 1230, and 1240 may comprise a solar cell with various materials stacked around the solar cell. As illustrated, the back sheet 1200 is configured to contain grooves 1270, 1280, and 1290, or cell tiles, into which the tiled solar cells 1220, 1230, and 1240 may be easily inserted. As such, the back sheet 1210 may be integrated with individual tiled solar cells 1220, 1230, and 1240. In some embodiments, a tedlar layer 1211, an encapsulation (EVA) layer 1212, EVA layer 1213, and a glass layer 1214 may be coupled to the back sheet 1210. Further details with regard to the back sheet 1210 and the tiled solar cells 1220, 1230, and 1240 are discussed in further detail below.

Figure 13:
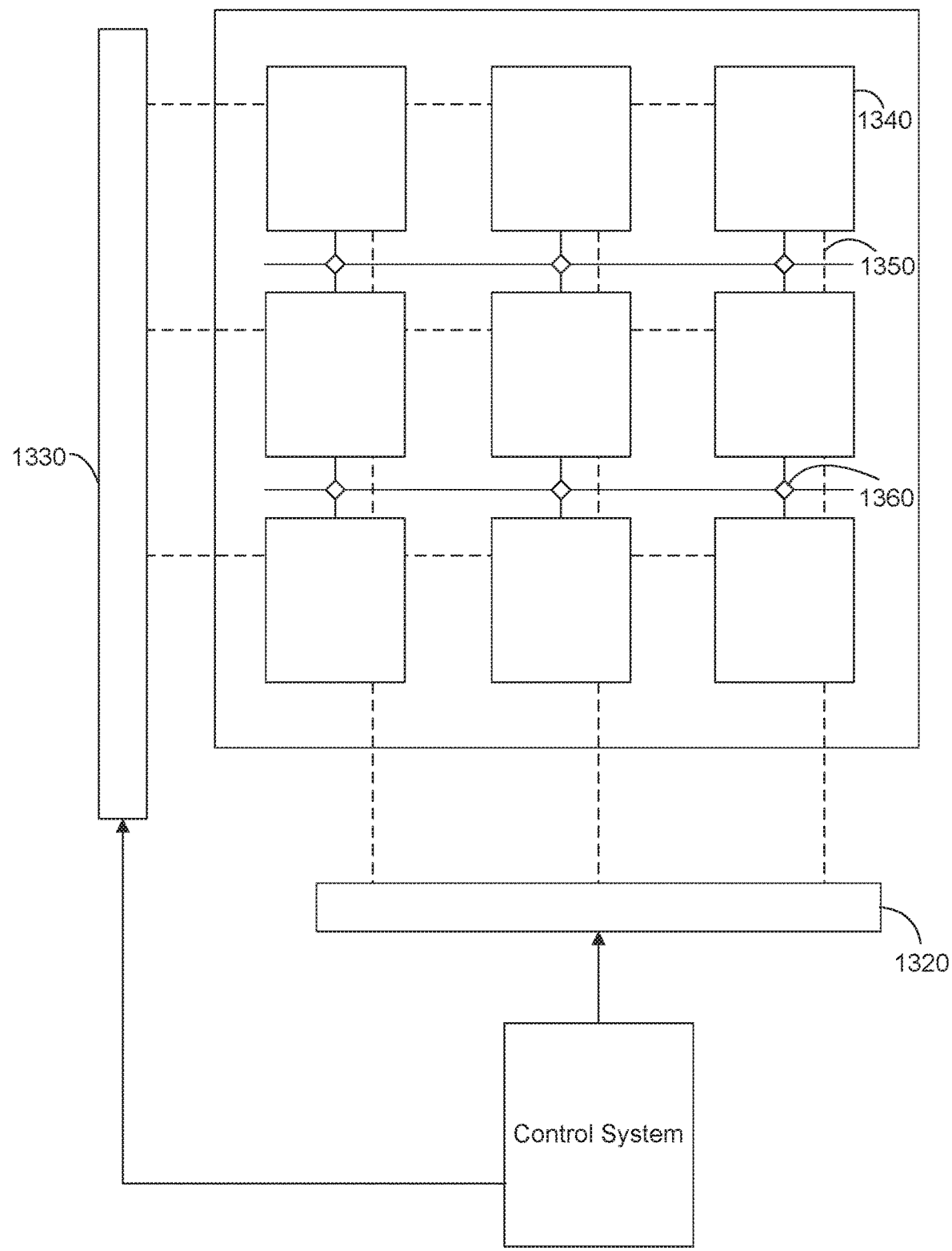
FIG. 13 illustrates an example embodiment of a back sheet used in accordance with some embodiments.

FIG. 13 illustrates an example embodiment of a back sheet 1300 used in accordance with some embodiments. In general, the back sheet 1300 comprises cell tiles arranged in rows and columns such that tiled solar cells may be inserted into the cell tiles of the back sheet 1300.

As illustrated in FIG. 13, the back sheet 1300 comprises a plurality of cell tiles 1340, current carrying grid 1350 for connecting the cell tiles 1340, and programmable electronics 1360. In some embodiments, the programmable electronics 1360 comprise programmable interconnects or switches, as described above. The current carrying grid 1350 couples the cell tiles 1340. Moreover, tiled solar cells (discussed below) may be inserted into the cell tiles 1340. For example, the cell tiles 1340 of the back sheet 1300 may accompany mechanical holders that secure inserted tiled solar cells. In some embodiments, turning the tiled solar cell in one direction when inserted into the back sheet 1300 may secure the tiled solar cell into the cell tile 1340. In the same embodiment, turning the inserted and secured tiled solar cell in the opposite direction may release the tiled solar cell from the cell tile 1340. The back sheet 1300 may further be coupled to a row selector 1330, address selector 1320, and control system 1310 to perform the monitoring and reconfiguration processes as discussed above.

As such, the back sheet with integrated tiled solar cells eliminates the need for a conventional solar module for housing solar cells. The elimination of the conventional solar module for housing solar cells and replacement of the solar module with the back sheet 1300 with individually tiled solar cells for insertion into cell tiles 1340 provides numerous advantages, as discussed in further detail below.

Figure 14:
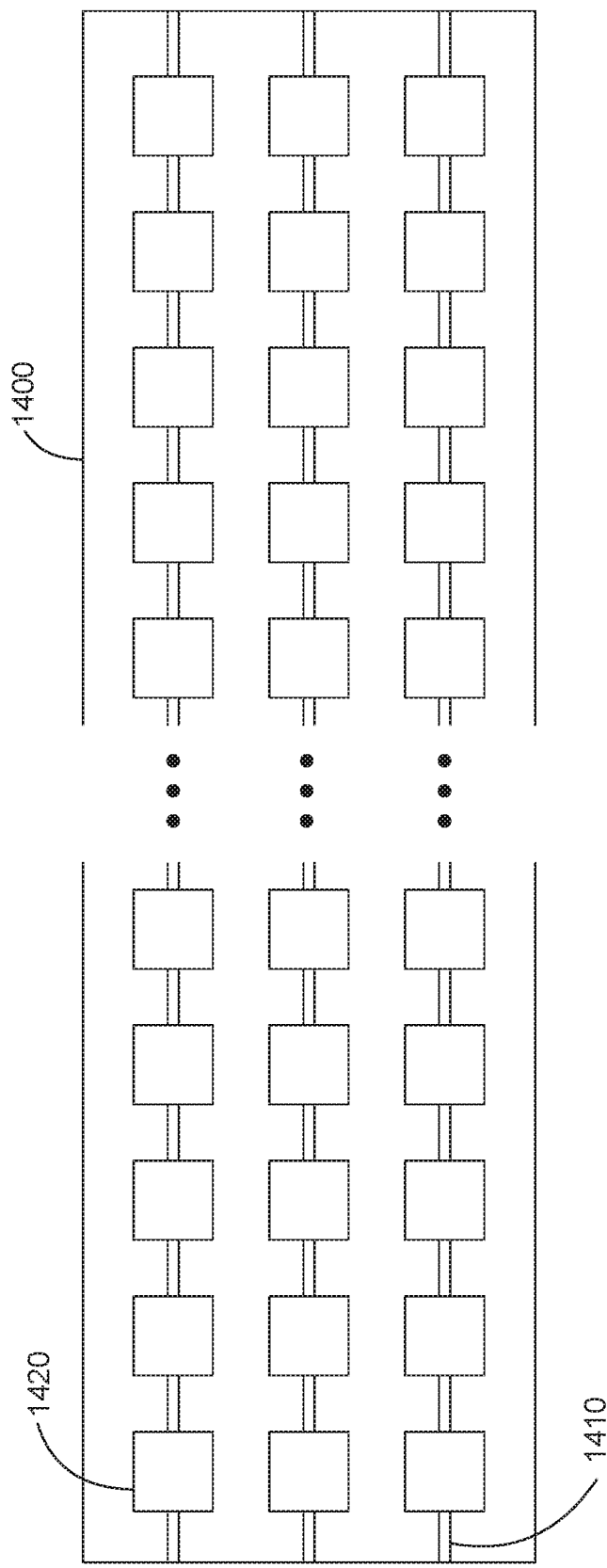
FIG. 14 illustrates an example embodiment of a back sheet implemented to match voltage specifications.

FIG. 14 illustrates an example embodiment of a back sheet 1400 implemented with tiled solar cells to match voltage specifications. In general, the back sheet 1400 may string together any number of cell tiles 1420 with interconnect 1410 between cell tiles 1420. In some embodiments, a tiled solar cell inserted into a cell tile 1420 may generate a predefined voltage output. As such, the number of cell tiles in a back sheet may be numbered to match a desired voltage output. Thus, the back sheet 1400 may be able to support variable voltage standards.

As discussed earlier, conventional solar power systems comprise the use of solar modules. As such, the level of granularity for the conventional solar power system is at the level of the solar modules. As a result, if each solar module comprises a 100 volt output and the solar power system needs to meet a 680 volt output specification for insertion into an inverter, then only six solar modules may be used due to voltage specifications. This is because the conventional solar power system operates at a granularity level of solar modules. However, reducing the level of granularity to solar cells, or tiled solar cells, allows for a closer matching of the output specification.

As illustrated in FIG. 14, a back sheet. 1400 comprises a number of cell tiles 1420. The cell tiles 1420 are arranged in strings with interconnects 1410 coupling cell tiles 1420 in a string. The number of cell tiles 1420 may be variable. For example, if a 1000 volt output is needed and if each cell tile 1420 with an inserted tiled solar cell generates a 0.5 volt output, then a string with 2000 cell tiles would generate a 1000 output voltage. Although an example of 2000 cell tiles generating a 100 output voltage is provided, it should be appreciated that the use of the back sheet with cell tiles can be used to meet any variable voltage standard. Moreover, solar cell strings may be created to connect solar cells in series in such a way to match a voltage standard. For example, if a 1500 voltage output is specified and each solar cell comprises a 0.5 voltage, then a solar cell string comprises 3000 solar cells may be created.

Figure 15:
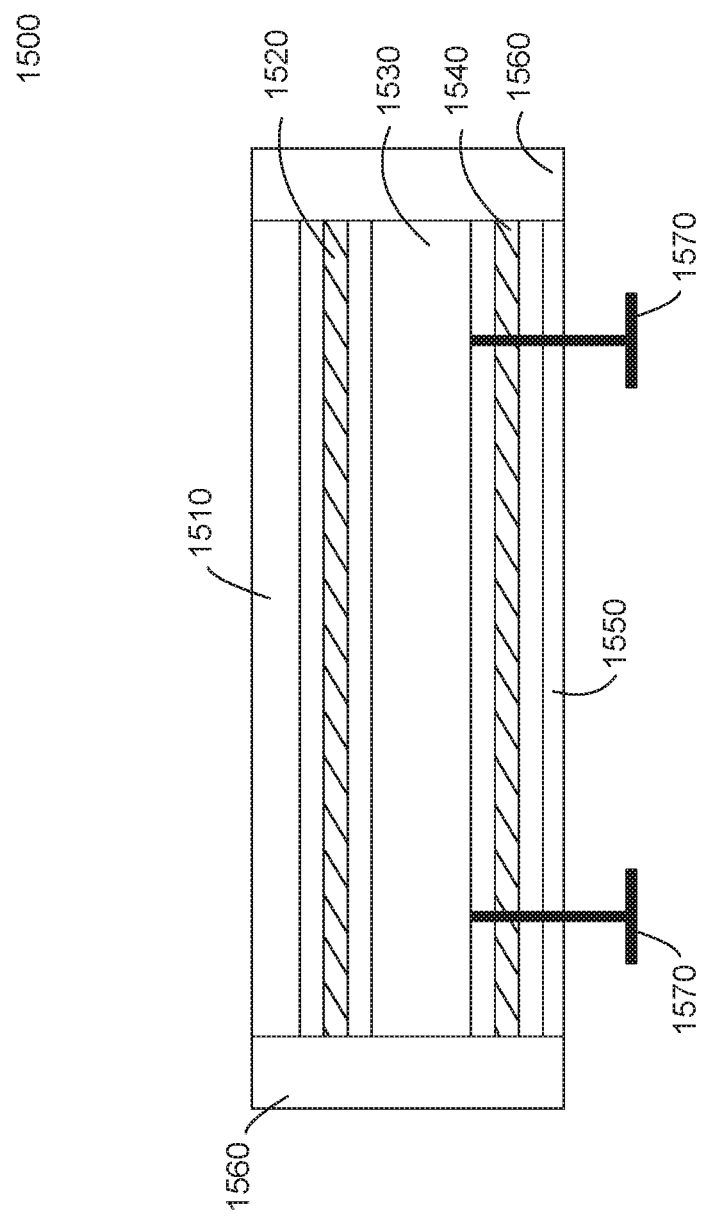
FIG. 15 illustrates an example embodiment of a solar cell used in accordance with some embodiments.

FIG. 15 illustrates an example embodiment of a tiled solar cell 1500 that may be used in conjunction with some embodiments of the back sheet. As illustrated, the tiled solar cell is comprised of a stack of various materials and components. A glass layer 1510 may be stacked on top of an encapsulation material. In some embodiments, the encapsulation material 1520 comprises ethylene vinyl acetate (EVA). The glass layer 1510 and encapsulation layer 1520 are stacked on top of the solar cell 1530. A second encapsulation layer 1540 is stacked immediately below the solar cell 1530. In some embodiments, the second encapsulation layer 1540 comprises an EVA material. A TEDLAR (polyvinyl fluoride) layer 1550 may be stacked below the second encapsulation layer 1540. The tiled solar cell may further comprise a pair of cell pins 1570 coupled to the encapsulated solar cell and protruding out of the TEDLAR layer 1550. In some embodiments, the cell pins 1570 are used to connect to a busbar and/or the current carrying grid of the back sheet. The tiled solar cell may further comprise an edge sealant 1560 on each edge of the tiled solar cell 1500. In some embodiments, the tiled solar cell stack may be laminated just as a solar module is laminated after a bonding step. As such, in some embodiments, each solar cell. 1530 within the tiled solar cell 1500 is protected in a similar manner as solar cells within a conventional solar module.

Thus, the tiled solar cell 1500 of FIG. 15 is an individually tiled solar cell such that the tiled solar cell may be placed into a back sheet. The tiled solar cell 1500 may be individually inserted or removed from the current carrying grid of a back sheet. For example, the tiled solar cell may be inserted into a groove or cell tile in the back sheet and turned to make a connection with the current carrying grid of the back sheet. Moreover, the same tiled solar cell may be removed simply by turning the tiled solar cell in the opposite direction. In some embodiments, the cell pins 1570 are configured to make an electrical contact with the current carrying grid comprised within the back sheet when the tiled solar cell 1500 is inserted into the back sheet. In the same or alternative embodiments, the cell pins 1570 make frictional contact with the current carving grid of the back sheet. The contact resistance between the tiled solar cell 1500 and the current carrying grid of the back sheet may be matched to prevent loss of energy in the form of heat dissipation. Thus, the tiled solar cells are easily plugged in and pulled out of the back sheet.

Figure 16:
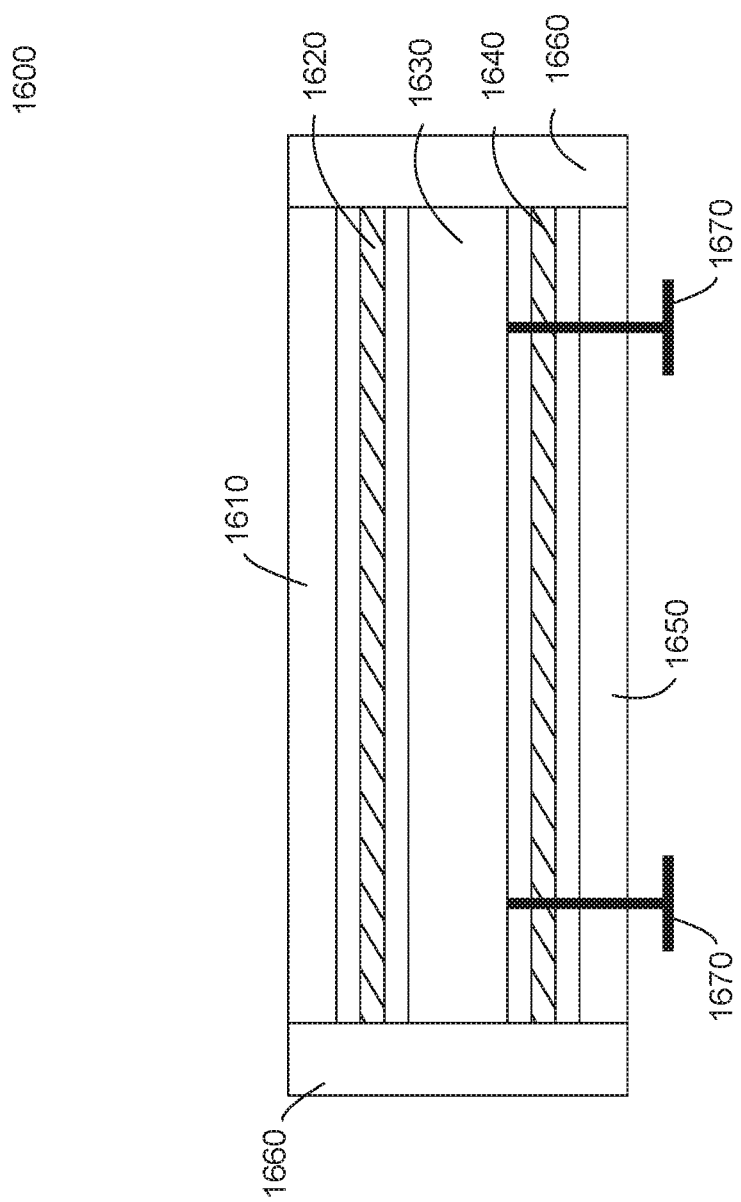
FIG. 16 illustrates another example embodiment of a solar cell used in accordance with some embodiments.

FIG. 16 illustrates another example embodiment of a tiled solar cell 1600 used in accordance with some embodiments. In general, the tiled solar cell 1600 comprises a glass layer on the top and bottom sides of the tiled solar cell 1600. As illustrated, the tiled solar cell 1600 is also comprised of a stack of various materials and components. A glass layer 1610 may be stacked on top of an encapsulation material 1620. In some embodiments, the encapsulation material 1620 may also comprise ethylene vinyl acetate (EVA). The glass layer 1610 and encapsulation layer 1620 are stacked on top of a solar cell 1630. A second encapsulation layer 1640 is also stacked immediately below the solar cell 1630. In some embodiments, the second encapsulation layer 1640 also comprises an EVA material. However, unlike the tiled solar cell 1500, a second glass layer 1650 is located at the bottom of the tiled solar cell 1600. The tiled solar cell may also further comprise a pair of cell pins 1670 coupled to the encapsulated solar cell 1630 and protruding out of the glass layer 1650. The tiled solar cell may further comprise edge sealants 1660 on each edge of the tiled solar cell 1500. As such, in some embodiments, each solar cell 1530 within the tiled solar cell 1600 is protected in a similar manner as solar cells within a conventional solar module that comprises solar cells. Moreover, the addition of the second glass layer 1650 instead of the TEDLAR layer of the tiled solar cell 1500 increases the robustness of the tiled solar cell 1500. Additionally, the glass layer 11650, located at the back of the tiled solar cell 1600, may provide the mechanical rigidity required for busbar leads to provide frictional contact with the current carrying grid comprised within the back sheet.

The tiled solar cell 1600 of FIG. 16 may also be an individually tiled solar cell such that the tiled solar cell may be placed into a back sheet, as discussed above with relation to the tiled solar cell 1500. As such, the tiled solar cell 1600 may also be individually inserted or removed from the current carrying grid of a back sheet in the same manner as the tiled solar cell 1500.

Figure 17:
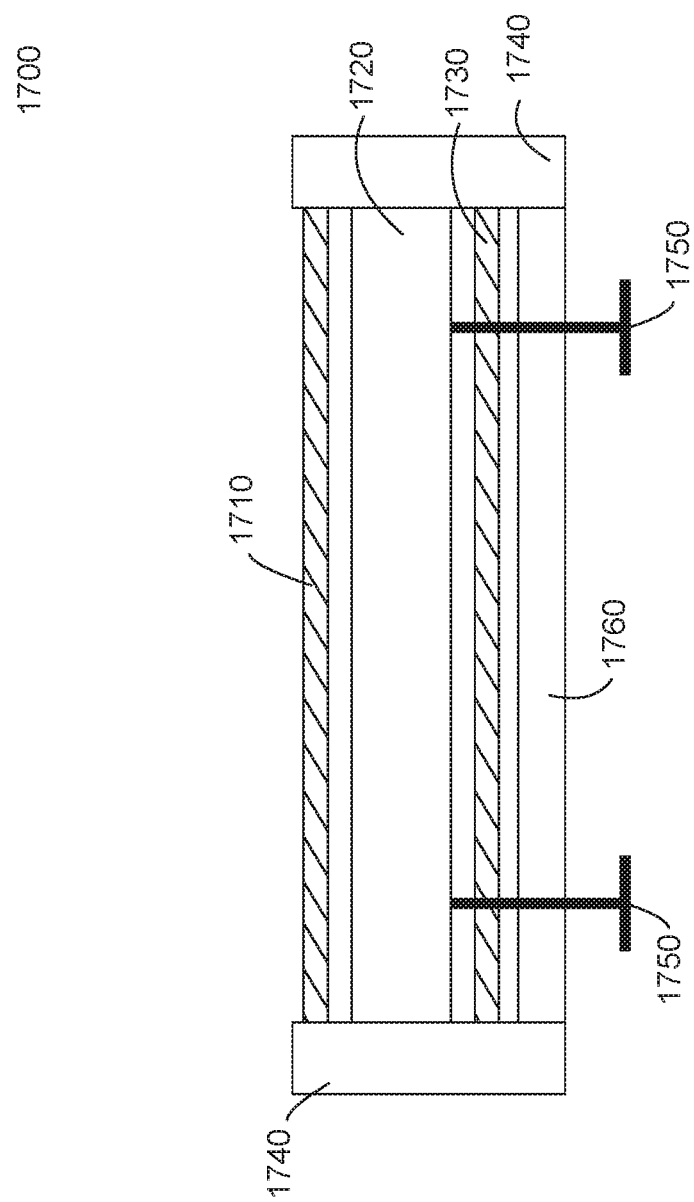
FIG. 17 illustrates an additional example embodiment of a solar cell used in accordance with some embodiments.

FIG. 17 illustrates another example embodiment of a tiled solar cell 1700 used in accordance with some embodiments of a solar power system. In general, the tiled solar cell 1700 comprises a glass layer on the bottom or back side and the front side or top layer comprises a polymer.

As illustrated in FIG. 17, the tiled solar cell 1700 is also comprised of a stack of various materials and components. An encapsulation layer 1710 may be stacked on the top, or front, of a tiled solar cell 1700. In some embodiments, the encapsulation material 1710 may comprise ethylene vinyl acetate (EVA). In this embodiment, the encapsulation layer 1710 is placed immediately on top of a solar cell 1730. Below the solar cell 1730 is a second encapsulation layer 1730. In some embodiments, the second encapsulation layer 1730 also comprises an EVA material. Moreover, a glass layer 17600 is located at the bottom of the tiled solar cell 1600 immediately below the second EVA layer 1730. The tiled solar cell may also further comprise a pair of cell pins 1750 coupled to the encapsulated solar cell 1720 and protruding out of the glass layer 1760. The tiled solar cell 1700 may further comprise edge sealants 1740 on each edge of the tiled solar cell 1700. As such, in some embodiments, each solar cell 1720 within the tiled solar cell 1700 is protected in just as solar cells within a conventional solar module are protected. As such, the tiled solar cell 1700 only comprises glass layer 1760 on the back side of the tiled solar cell 1700. The back side glass layer 1761) also provides needed rigidity to the tiled solar cell 1700 and serves to provide mechanical rigidity needed for busbar leads. Moreover, the front side or top of the tiled solar cell 1700 comprises the encapsulation layer 1720 which allows the solar cell 1730 to be exposed to sunlight.

The tiled solar cell 1700 of FIG. 17 may also be an individually tiled solar cell such that the tiled solar cell may be placed into a back sheet, as discussed above with relation to the tiled solar cell 1500 and tiled solar cell 1600. As such, the tiled solar cell 1700 may also be individually inserted or removed from the current carrying grid of a back sheet in the same manner as the tiled solar cell 1500 and tiled solar cell 1600.

In some embodiments, the tiled solar cells disclosed above may comprise an optically tuned glass layer in order to realize concentrated photovoltaic (CRV) cells. Since the tiled solar cells may comprise a glass layer with optical properties embedded in the glass layer, the tiled solar cell may function as a CPV cell handling multiple light sources focused on the tiled solar cell. As such, when the tiled solar cells are arranged into a solar cell matrix on a hack sheet, the solar cell matrix may be composed of optically charged (CPV) tiled solar cells for an increased performance.

Figure 18:
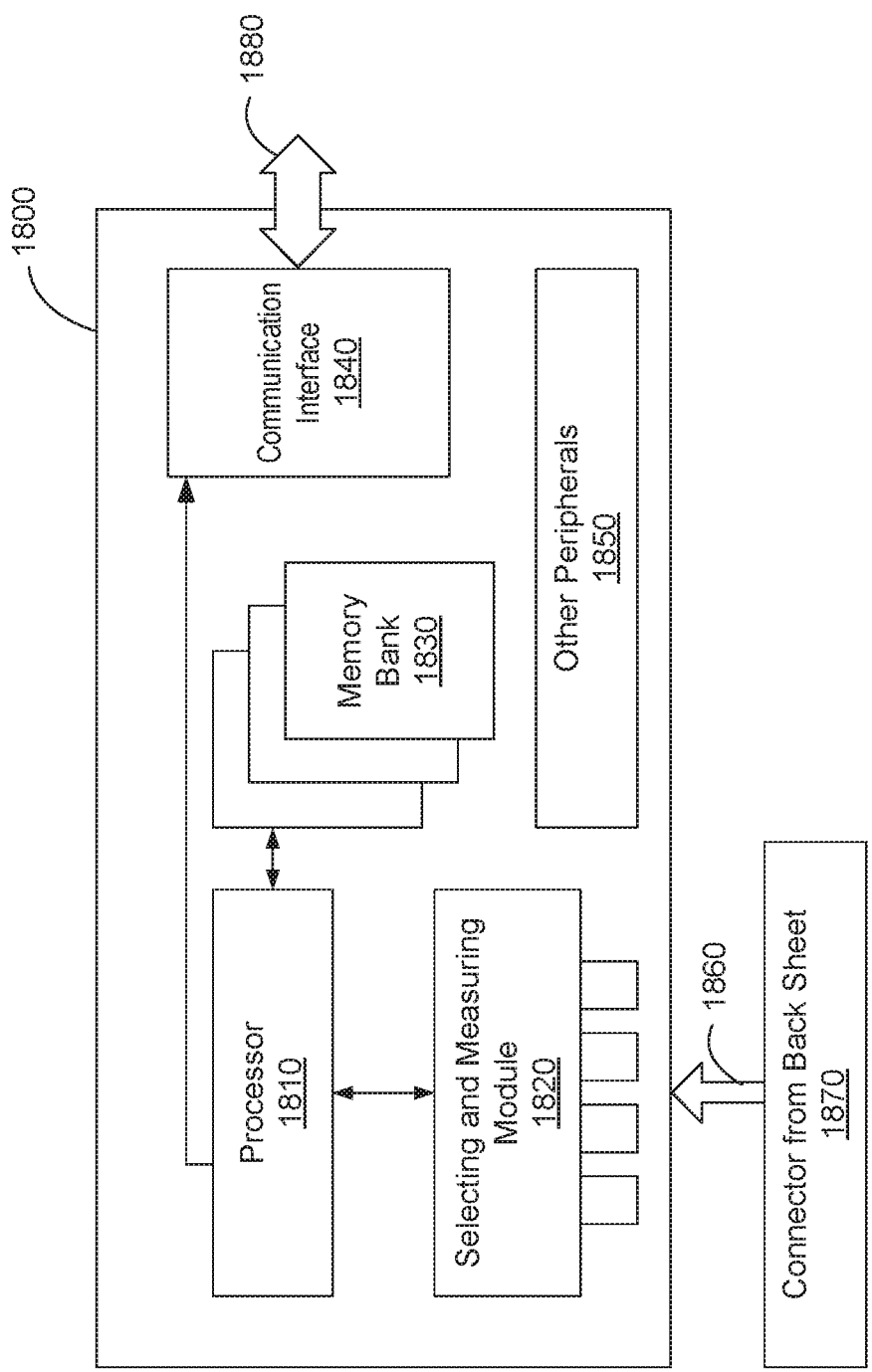
FIG. 18 illustrates an example embodiment of a control system used in accordance with some embodiments.

FIG. 18 illustrates an example embodiment of a control system for the monitoring and reconfiguration of solar cells used in accordance with some embodiments of the present invention. In general, in some embodiments, the control system comprises a printed circuit board (PCB) that may comprise various modules and components. In the same or alternative embodiments, the PCB is integrated into a junction box that is attached to a hack sheet and configured to receive measurements and sensor outputs from each of the enabled solar cells that have been inserted into the back sheet. In some embodiments, the junction box may be thermally managed.

As illustrated in FIG. 18, a control system 1800 may comprise various components, modules, and/or connections. For example, the control system 1800 may comprise a processor 1810. In some embodiments, the processor 1810 is a microprocessor configured to make determinations based on the state of the solar cells by examining measurements and sensor outputs. The control system 1800 may further comprise a selecting and measuring module 1820 that is configured to receive data from the solar cells installed on the back sheet. In some embodiments, the selecting and measuring module 1820 comprises a row selector and measuring device selector. The selecting and measuring module 1820 is coupled to the processor 1810 in order to send data to the processor. The control system 1800 may further comprise a memory bank 1830 that is coupled to the processor 1810. In some embodiments, the memory hank 1830 may store data or log information that has been processed by the processor 1810. The control system 1800 may further comprise a communications interface, coupled to the processor, for communicating with a server (not shown) over a connection 11880. Some embodiments of the control system 1800 may hither comprise additional peripherals 1850 to provide various functions with regard to the monitoring and reconfiguring of solar cells installed on a back sheet.

In operation, the control system 1800 of FIG. 18 generally monitors and reconfigures individual solar cells that have been installed into a back sheet comprising a current carrying grid. In some embodiments, a single control system 1800 is coupled to or installed within a back sheet and may be capable of monitoring and reconfiguring every individual solar cell that has been installed into the back sheet. As a result, a single control system 1800 may control all solar cell monitoring and reconfiguring for an entire back sheet comprising a plurality of solar cells. The control system 1800 may be coupled to a connector or interconnect of the back sheet such that the control system 1800 may have access to electrical traces to each of the solar cells. As such, the control system 1800 may receive monitoring information and sensor outputs for each individual solar cell on the back sheet.

The selecting and measuring device 1820 may select or enable an individual solar cell or an entire row of a solar cell matrix for measuring the solar cell's voltage and/or current, as discussed above. In some embodiments, the selecting and measuring device 1820 may also monitor sensor outputs that may measure the irradiance, humidity, and/or temperature of the individual solar cell, group of solar cells, or the back sheet. The measurement data, which may comprise, but is not limited to, any or all of a measured voltage, current, irradiance, humidity, or temperature, is then transmitted to the processor 1810. In some embodiments, the processor 1810 is configured to make determinations of a solar cell based on the state of the solar cell. For example, the processor 1810 may make a determination based on the measured values of current, voltage, temperature, humidity, and/or irradiance related to the solar cell. In some embodiments, the processor 1810 may then make a determination for the solar cell. Examples of such determinations may comprise, but are not limited to, leaving the solar cell intact, bypassing the solar cell, bypassing and reconfiguring the solar cell, reconfiguring solar cell strings, and/or create solar cell forecasting information.

As such, the processor 1810 of the control system 1800 of FIG. 1.8 may not change the state of a solar cell and, as a result, the solar cell may be left in a series string with other solar cells. The processor 1810 may bypass at least one solar cell. For example, the processor 1810 may receive current and voltage measurements related to one solar cell. The processor 1810 may determine that the current and voltage measurements are out of specification for the solar cell and thus bypass the solar cell, as described above. Moreover, the processor 1810 may determine to bypass the solar cell, but to reconfigure the programmable interconnect fabric so that energy generated from the bypassed solar cell is collected onto a parallel bus, as described above in further detail. Additionally, the processor 1810 may reconfigure solar cells and the programmable interconnect fabric such that solar cells of certain operating performance are connected in series with other solar cells of similar operating performance, as discussed in further detail above. The processor 1810 may also further record a solar cell's measurements as taken over time. As such, the processor 1810 may review the historical performance of a solar cell and through the use of processing algorithms may forecast a time bounded behavior of the solar cell. For example, the processor 18110 may forecast the approximate operating lifespan of the solar cell and when the solar cell will approximately fail or reach a certain threshold.

In some embodiments, other electronics may be implemented into a junction box coupled to the back sheet in order to provide direct access and management of the solar cells. For example, a Direct Current to Direct Current (DC-to-DC) converter may be included to provide an independent operation of a solar cell with respect to a solar cell string. Additional electronics may be included to process the output of the solar cells directly, such as converting to Alternating Current (AC) at the solar cell level, and delivering energy to an output. As such, a variety of electrical components and equipment may be used to perform the monitoring and reconfiguring of the solar cells installed on the back sheet.

In some embodiments, the memory bank 1830 may comprise a machine-readable medium able to store data temporarily or permanently and may be taken to include, but not be limited to, random-access memory (RAM), read-only memory (ROM), buffer memory, flash memory, and cache memory. While the memory bank 1830 may comprise a single medium, the memory bank 1830 may comprise multiple media (e.g., a centralized or distributed database, or associated caches and servers) able to store instructions and/or data. The term memory bank 1830 may be capable of storing instructions or data (e.g., software) for execution by a machine such as the processor 1810, such that the instructions or data, when executed by the processor, cause the processor 1810 or control system 1800 to perform any one or more of the methodologies described herein. The memory bank 1830 may comprise, but not be limited to, a data repository in the form of a solid-state memory, an optical medium, a magnetic medium, or any suitable combination thereof.

Figure 19:
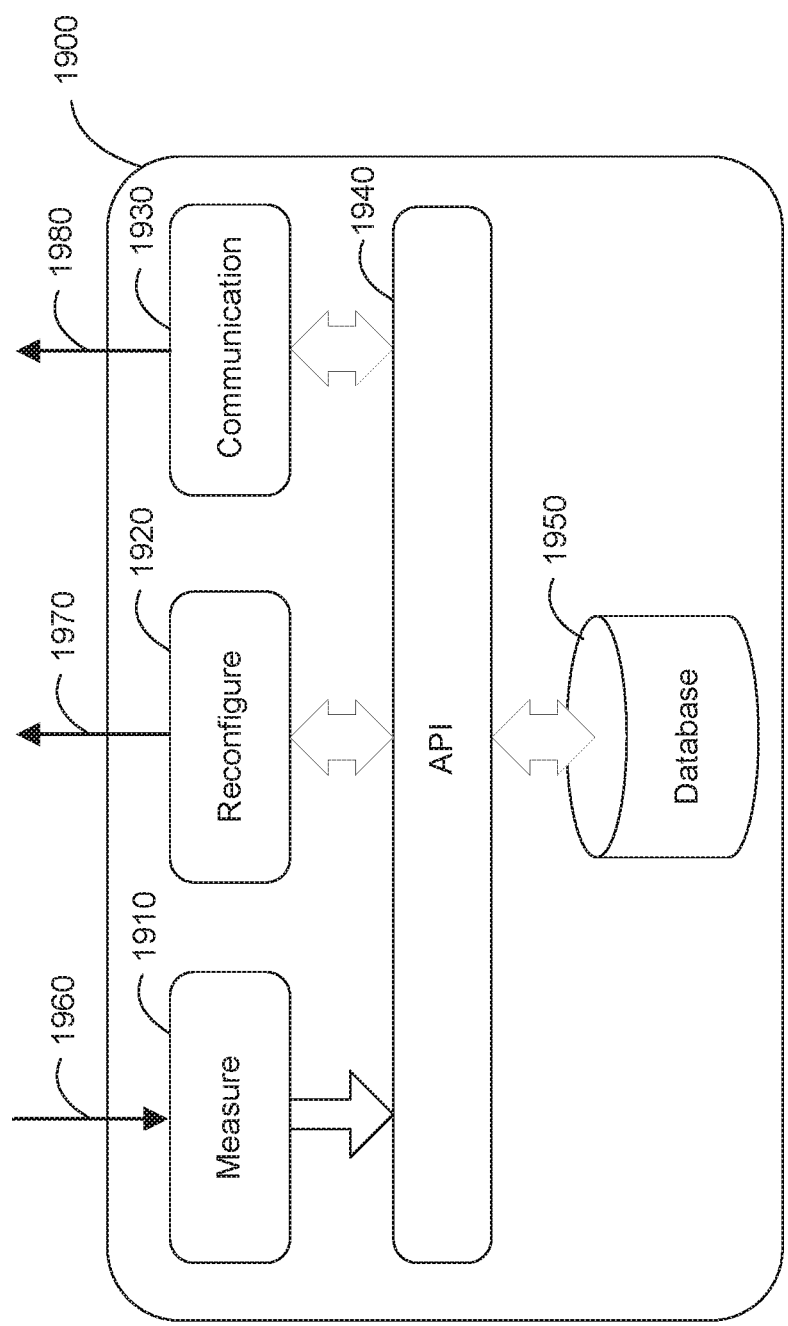
FIG. 19 illustrates an example embodiment of an embedded software architecture used in some embodiments.

FIG. 19 illustrates an example embodiment of an embedded software architecture 1900 for use in the monitoring and/or reconfiguring of solar cells. In some embodiments, the embedded software architecture 1900 may be comprised within the memory bank 1830 of the control system 1800. In general, the embedded software architecture 1900 may be used by the processor 11810 to perform the monitoring and reconfiguring algorithms.

As illustrated in FIG. 19, the embedded software architecture 1900 comprises a measure module 1910, reconfigure module 1920, communication module 1930, Application Programming Interface (API) 1940, and database 1950. In some embodiments, the measure module 1910 measures the solar cell sensors and voltage and/or current readings from solar cells and records the measured data and readings through the use of the API 1940 and a consistent data model. The data is then accessed by the reconfigure module 1920 by using the API 1940 to build a set of learning algorithms that may determine how the reconfiguration may occur. The reconfiguration information from the reconfigure module 1920 is then passed to a cross bar switch (not shown) in the control system 1800, which may perform the various interconnect connections or disconnections between solar cells to build the solar cell strings within the solar cell matrix of the back sheet dynamically. The database 1850 may comprise detailed data about the measurements and readings with regard to individual solar cells. For example, the database 1850 may comprise historical measurements with regard to a solar cell's current, voltage, irradiance, humidity, and/or temperature conditions. In some embodiments, the database may comprise an initial current-voltage (IV) curve captured at the manufacturing process. This initial IV curve may thus serve as an initial baseline characteristic. Through the operating life of the solar cells, the solar cell's current, voltage, irradiance, humidity, and/or temperature conditions may be recorded and/or timestamped within the database 1950 at each point in time that the measurements are taken. As such the database 1950 may comprise the historical conditions of each solar cell. Thus, the embedded software architecture 1900 may analyze the stored historical conditions and determine or predict a failure occurrence of a solar cell before the failure actually occurs. For example, the embedded software architecture 1900 may observe deviations from initial baseline characteristics and thus forecast an eventual failure occurrence for the solar cell. As a result, the failure forecasting may make it possible to perform proactive maintenance of the solar cells as opposed to an unplanned maintenance of the solar cells and to manage just-in-time inventory.

Figure 20:
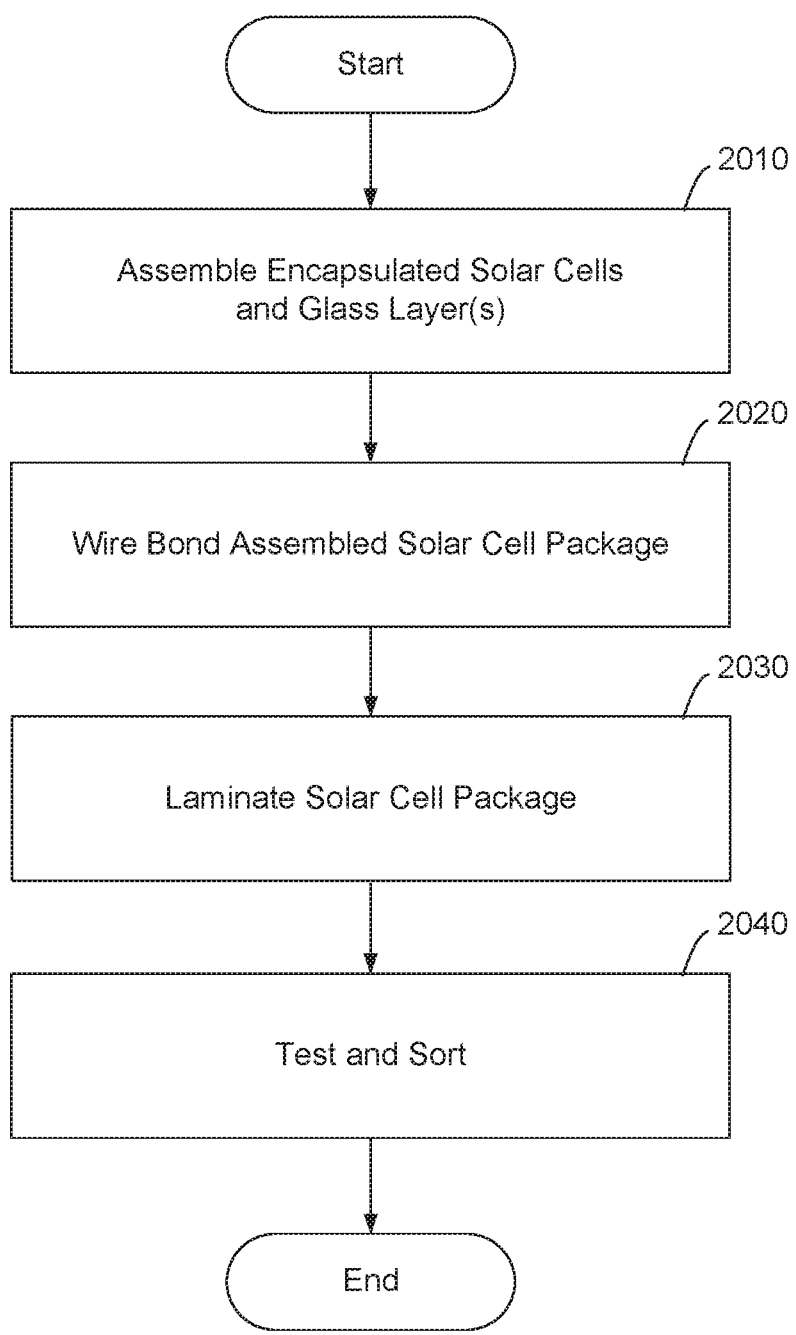
FIG. 20 is a flow diagram of a method of manufacturing a tiled solar cell in accordance with some embodiments.

FIG. 20 illustrates a flow diagram for a method 2000 of manufacturing a tiled solar cell. As illustrated, at block 2010, encapsulated solar cells are assembled to at least one glass layer. In some embodiments, the solar cells are encapsulated and sealed by an EVA material and the glass is a low iron (low Fe) glass layer. As such, the encapsulated solar cells are assembled to the low Fe glass layer. Next, at block 2020, a wire bonder assembles the solar cell package comprising the assembled encapsulated solar cells and glass. At block 2030, the solar cell package is laminated. In some embodiments, the lamination is done via a single thermal cycle on a laminator. As such, in some embodiments, a tiled solar cell has been created after block 2030. At block 2040, in some embodiments, a tiled solar cell is tested and sorted. The tiled solar cell ma be tested to see whether it meets a predefined manufacturing characteristic(s). For example, the tiled solar cell may be tested to determine whether the tiled solar cell comprises a 100% output efficiency. If the tiled solar cell does not comprise such an efficiency, then it may be sorted out and replaced with another tiled solar cell comprising an ideal output efficiency.

Figure 21:
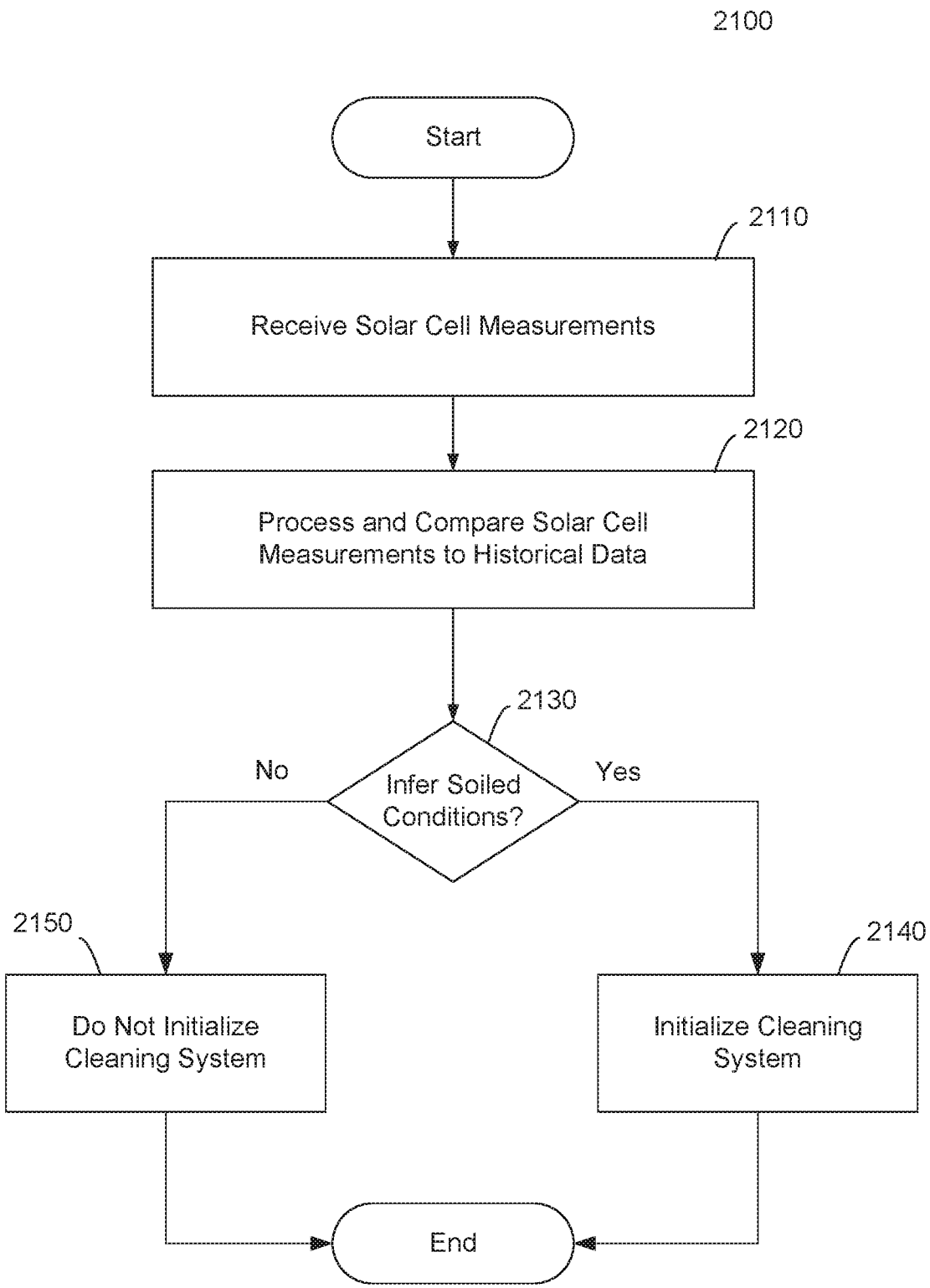
FIG. 21 illustrates a flow diagram of a method of using an intelligent cleaning system for a solar power system.

FIG. 21 illustrates a flow diagram of a method 2100 for initializing an intelligent cleaning system for a solar power system. In general, the intelligent cleaning system may be initialized if the system detects that the solar cells may be soiled or dirty such that the solar cells are not operating at a maximum performance. As such, the intelligent cleaning system may remove foreign matter. In some embodiments, the intelligent cleaning system may use water or a water based solution to remove the foreign matter.

As illustrated in FIG. 21 at block 2110, measurements of a solar cell are received. In some embodiments, the measurements of a solar cell may comprise, but are not limited to, current, voltage, humidity, irradiance and/or temperature of the solar cell. At block 2120, the measurements may be processed and the current solar cell characteristics may be compared to historical trends of the solar cell's characteristics. For example, IV characteristics of each solar cell may be compared to the solar cell's historical IV characteristics. As such, if the current IV characteristics show a deviation from historical trends, then the solar cell may be partially covered by foreign matter that is reducing the solar cell's performance and thus its IV characteristics. At block 2130, a determination is made whether it can be inferred that foreign matter is at least partially covering a solar cell. In some embodiments, the intelligent cleaning system may utilize a weather sensor in conjunction with analyzing the historical trends of a solar cell's characteristics in order to determine whether the system may infer that foreign matter exists on the solar cell. For example, a weather sensor may indicate particularly heavy cloud cover in the vicinity of the solar cell. As such, the solar cell performance and characteristics may suffer due to the cloud cover preventing sunlight or other light sources from reaching the solar cell. In such a case, the intelligent cleaning system may infer that the degradation in the solar cell's performance or characteristics is due to the weather and not due to foreign matter being present on the solar cell. As such, at block 2150, the intelligent cleaning system is not initialized if it is determined foreign matter or soiled conditions are not present with respect to the solar cell. However, at block 2140, the intelligent cleaning system is initialized if it is determined or inferred that foreign matter exists on the solar cell.

In some embodiments, measurements from an irradiance sensor and historical trends in solar cell outputs may be used to determine or inter whether foreign matter exists on the solar cell. For example, the system may monitor the output level of the solar cells and notice that the output level has decreased from an expected output level. In some embodiments, the expected output level may be computed from the measurements of the irradiance sensor and/or expected solar cell output. The system may analyze the irradiance sensor output and historical trends in the solar cell data. As such, the intelligent cleaning may wash the solar cell with a fluid in order to remove the foreign matter. In some embodiments, the system may group solar cells and perform the above monitoring and computing processes as described above for every solar cell in a group.

In some embodiments, the method 2100 of FIG. 21 may measure an I/V (current/voltage) output for each solar cell in the solar cell array. The insolation at the site of the solar cell array may be measured through an external pyranometer. Based on the insolation or irradiance, the expected for each solar cell is computed. In some embodiments, the expected I/V may be computed based on the initial I/V of the solar cell at the time of manufacturing. If the measured I/V of a solar cell under insolation deviates from an expected I/V of the solar cell, then there may be a shadow on the solar cell or foreign matter may exist on the solar cell. In some embodiments, the system may track the I/V of the solar cell over a period of time. For example, if the of a solar cell changes over a few hours, then the loss in performance or I/V of the solar cell is likely due to a shadow present on the solar cell. In some embodiments, the I/V loss may be measured over two consecutive days in order to check whether the performance loss occurs at the same time and magnitude with the same step loss. In some embodiments, the detection of a shadow may issue an alert such that corrective action may be made to prevent loss of performance due to the shadow. Otherwise, if the loss in performance of the solar cell is constant over a period of time, then the loss in performance may be due to foreign matter being present on the solar cell. In this case, a cleaning system ma be triggered.

Figure 22A:
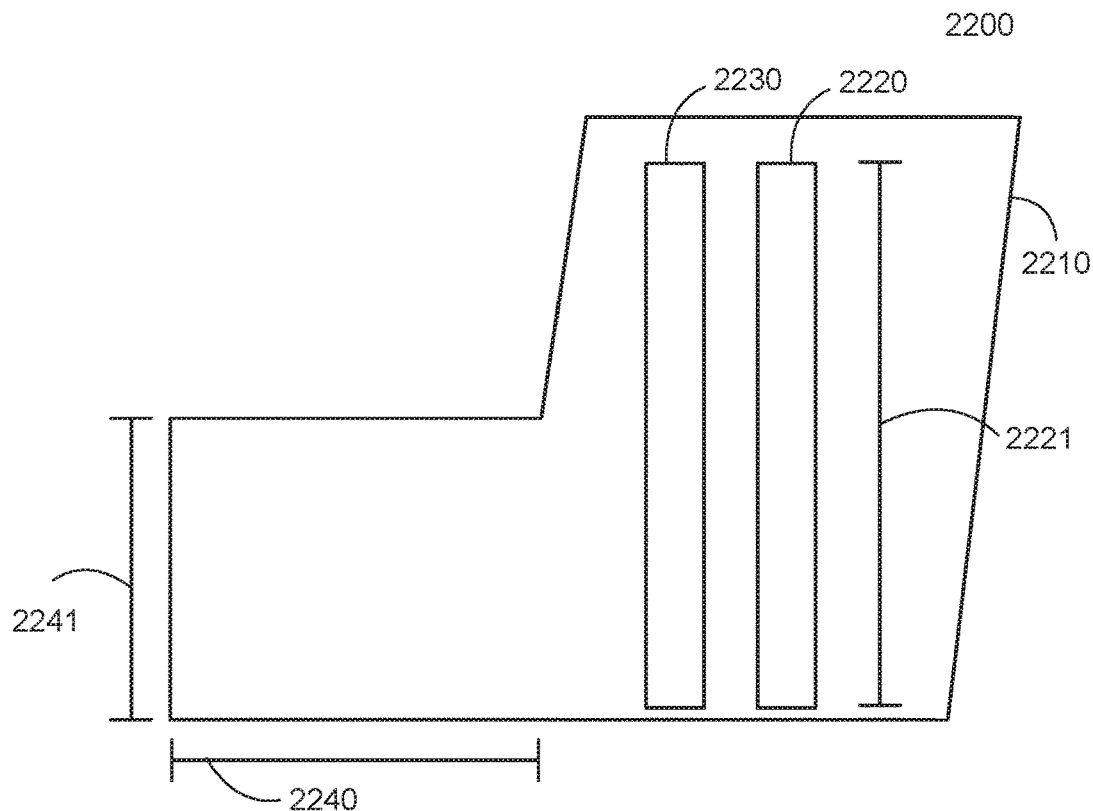
FIG. 22a illustrates the installation of conventional solar modules on a parcel of land.

FIG. 22a illustrates an installation 2200 of conventional solar modules onto a surface. As illustrated, the installation 2200 comprises the placement of solar modules 2220 and 2230 onto a surface (e.g., a parcel of land) 2210. The solar modules 2220 and 2230 comprise identical fixed dimensions as defined in the design and manufacturing process of the solar module. For example, each solar module 2220 and 2230 comprises a dimension 2221. However, as is evident, the dimension length 2221 of each solar module 2220 and 2230 is significantly larger than the length 2241 of the segment 2240 of the surface 2210. As such, neither of the solar module 2220 nor the solar module 2230 may be installed into the segment 2240. Thus, when conventional solar modules are used, a portion of the surface 2210 is unused.

Figure 22B:
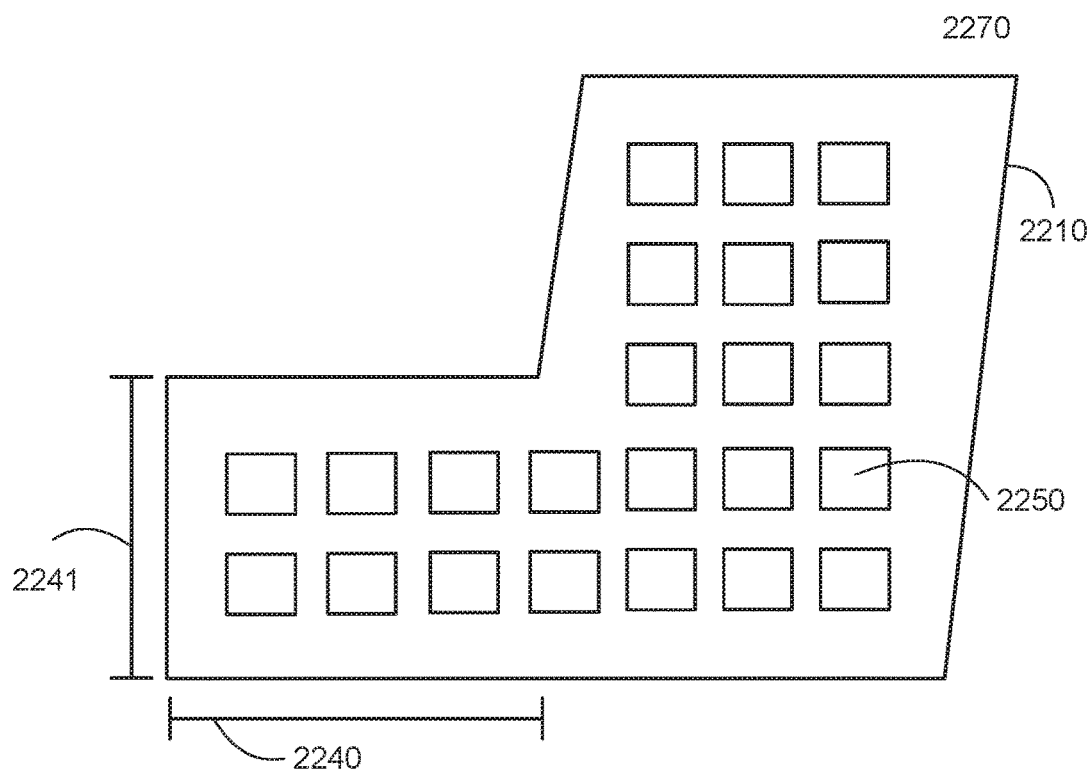
FIG. 22b illustrates an example embodiment of the installation of a back sheet with tiled solar cells onto a parcel of land.

FIG. 22b illustrates an example embodiment of the installation 2270 of a back sheet with tiled solar cells onto the same surface 2210. In some embodiments, the surface 2210 may comprise, but is not limited to a parcel of land, a roof of a building, exterior of a building or structure, a hill side, sloped terrain, and/or any curved surface. As illustrated, the installation 2210 comprises the placement of tiled solar cells 2250 onto the surface 2210. As is evident, the tiled solar cells 2250 comprise smaller dimensions than the conventional solar modules 2220 and 2230 and the dimension 2241. As such, the tiled solar cells 2250 may be placed into the surface segment 2240. As a result, the tiled solar cells 2250 may be installed on more of the area of the surface 2210. Since the tiled solar cells 2250 may be placed into the surface segment 2240, then the installation of a system using the tiled solar cells 2250 may produce more energy than a system using the conventional solar modules 2220 and 2230 due to the increased ground coverage.

As discussed earlier, a back sheet may comprise a current carrying grid, programmable interconnect, and cell tiles into which tiled solar cells 2250 may be inserted. As such, the back sheet may be placed into the surface segment 2240 and the rest of the surface 2210. In some embodiments, the back sheet may be configured or implemented such that the back sheet fits into the contours, dimensions, and or shape of the surface 2210. As such the back sheet may be placed onto a curved surface or a surface with irregular dimensions. Tiled solar cells 2250 may then be inserted into the back sheet in order to create a solar power system comprising tiled solar cells that cover much of an available surface.

Figure 23:
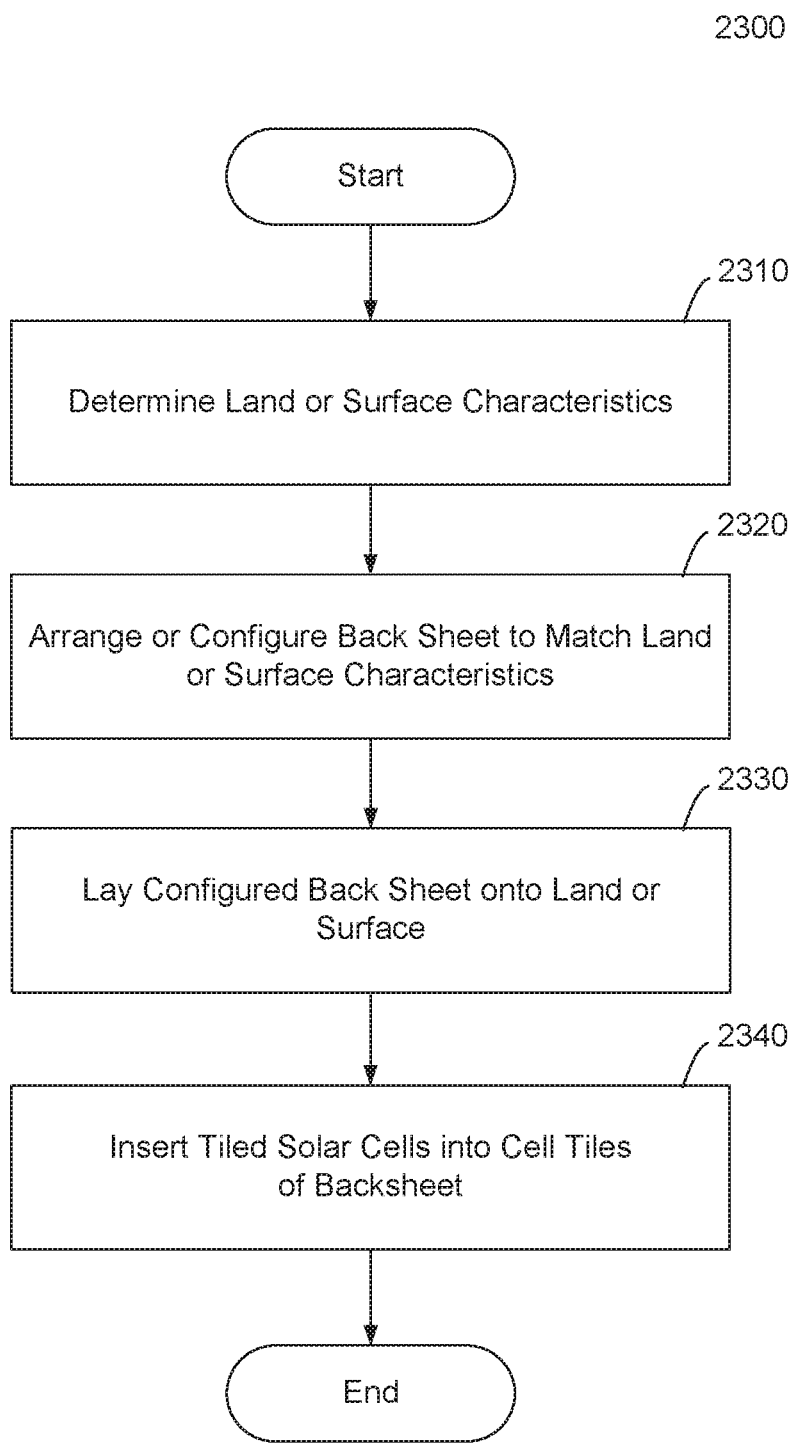
FIG. 23 illustrates a flow diagram of a method of installing a back sheet with tiled solar cells in accordance with some embodiments.

FIG. 23 illustrates a flow diagram of a method 2300 of installing a back sheet with tiled solar cells in accordance with some embodiments of the present invention. The method 2300 starts, at block 2310, by determining the land or surface characteristics to which the back sheet with tiled solar cells will be installed. For example, the land or surface dimensions, contours, and/or shape may be determined. In some embodiments, voltage output standards for the land or surface may also be determined. At block 2320, the back sheet is arranged or configured to match the land or surface characteristics or example, the back sheet may be configured so as to spread and cover across a roof. In some embodiments, the back sheet may be arranged to fit into irregular dimensions of a surface area or parcel of land. In other embodiments, the back sheet may be arranged or configured such that the cell tiles of the back sheet produce a voltage needed by an inverter. For example, the back sheet or solar cell strings may be arranged to produce voltage outputs of 1200 volts or 2000 volts. At block 2330, the back sheet is placed onto the land or surface. Next, at block 2340, tiled solar cells may be inserted into the cell tiles of the back sheet. In some embodiments, the tiled solar cells may be inserted into the cell tiles of the back sheet before the back sheet is placed onto the land or surface.

Additional Advantages of the Back Sheet with Tiled Solar Cells

An implementation of the back sheet with tiled solar cells provides numerous advantages over a conventional system comprised of solar modules that house solar cells. For example, each solar cell in the tiled solar cell receives the same protection as it would from being housed within a conventional solar module. As such, individual tiled solar cells may be mass produced with few additional steps in a cell manufacturing plant. The elimination of the solar module results in savings from the lack of module manufacturing costs. For example, the back sheet with tiled solar cells does not require a tabbing and stringing process as is done in the manufacturing of solar modules. As such, costs in acquiring tabbing and stringing equipment may not be necessary for the manufacturing of the back sheet and tiled solar cells. Moreover, large format glass costs are eliminated as each individual tiled solar cell may comprise a smaller format glass layer when compared to the large format glass layer of a solar module. Transportation costs for the tiled solar cells and back sheet would also be less when compared to conventional solar modules since the tiled solar cells ma be packaged into containers and may comprise a lower weight, lesser yield costs due to reduced breakages, lower wiring costs due to the compactness of solar cells, and less or no DC cables for interconnections. The back sheet may also comprise a variety of lengths or sizes (and thus implemented with various numbers of tiled solar cells) as compared to a conventional solar module that is of a fixed length or size. As such, the back sheet with tiled solar cells may result in lower land costs as the back sheet with tiled solar cells may comprise a higher packing density of solar cells relative to the conventional solar module.

Since the solar cells are comprised within individually tiled solar cells that are implemented on a back sheet, the back sheet and/or tiled solar cells may be placed onto land with varying dimensions or on curved contours. As such, the back sheet with tiled solar cells provides more flexibility in the mounting of the solar power system on different types of surfaces or land. This may result in an increased ground coverage ratio.

The system comprising a back sheet and tiled solar cells would also comprise easier installation and maintenance as well as more cost effective installation and maintenance. For example, the tiled solar cells may be easily dismounted from mechanical holders attached to the back sheet. As such, the tiled solar cells may be easily replaced. Thus, if a single tiled solar cell is not functioning at a certain specification, then the single tiled solar cell may be removed instead of an entire conventional solar module being removed. As a result, maintenance and installation costs for tiled solar cells may be significantly lower than that of replacing a solar cell housed within a conventional solar module.

The systems, circuits, and methods disclosed herein also provide easier thermal management. As the tiled solar cells are individually exposed and not sealed inside a conventional solar module, the heat that may develop through sun exposure may be thermally managed away through the use of fins heat sinks, and other heat dissipation techniques.

As discussed above, the systems, circuits, and methods disclosed herein also provide the monitoring and reconfiguring at the solar cell level. This finer level of granularity, when compared to granularity at the conventional solar module level, provides a more robust and efficient system Additional for Embodiments The current disclosed embodiments may be targeted by various applications. For example, such applications may comprise, but are not limited to, solar cell level monitoring, solar cell level reconfiguring, data logging of solar cell characteristics, in-situ testing of solar cells during the manufacturing process, and intelligent cleaning systems for solar power systems.

A solar cell level monitoring application may comprise each solar cell in the back sheet being measured and tracked under varying conditions of temperature, humidity and irradiance. Each solar cell may also be monitored with respect to its voltage and/or current. With the more detailed granularity level of monitoring at the solar cell level, a solar cell monitoring application may understand and determine solar cell aging and degradation, develop models to forecast a failure mode for the solar cell or approximately when the solar cell will fail. These forecasts may assist with proactive maintenance and just-in-time inventory management. Moreover, the solar cell monitoring application may be able to infer soiling and shading conditions. For example, the solar cell monitoring application may develop a historical record of a solar cell's operating performance and characteristics. If the solar cell is functioning out of specification then the solar cell monitoring application may be used to determine whether the solar cell has degraded to below specifications or if temporary soiling and shading conditions are responsible for the degradation in the performance of the solar cell.

A solar cell level reconfiguring application may comprise solar cell strings that are dynamically built and re-built to react to changing ambient conditions of solar cells in real time. This reconfiguration of solar cell strings allows for optimizing solar cell string performance to maximum power point tracker (MPPT), match voltage specifications, and to re-build the solar cell strings to avoid the negative impact of shaded, soiled, or degraded solar cells.

A data logging application may comprise measured data of solar cells being saved in a database for extended periods of time. This recorded information may then be used for various types of analyses of the solar cells, such as root cause failure analysis An in-situ testing of solar cells application may occur during the manufacturing and assembling process. In some embodiments, after the tiled solar cells have been placed on the back sheet for interconnection, an in-situ testing step may be performed to check each tiled solar cell in the tiled solar cell string in order to ensure that the tiled solar cell is operating within specifications. If there is any tiled solar cell that exhibits abnormal behavior within the tiled solar cell string, then that tiled solar cell may be easily replaced by a functioning tiled solar cell.

An intelligent cleaning system application may comprise a more efficient cleaning system for solar power systems. The ability of the software algorithms discussed above may infer when a solar cell has been shaded or soiled by foreign matter. As such, it would be possible to integrate a cleaning system that turns on only when needed to clean the solar cells and to effectively remove the foreign matter from the solar cells. This integration will result in the conservation of cleaning fluid, such as water, as the cleaning fluid is only used when foreign matter is shading a portion of a solar cell and inhibiting overall solar cell performance.

Although the present invention has been described in terms of specific exemplary embodiments, it will be appreciated that various modifications and alterations might be made by those skilled in the art without departing from the spirit and scope of the invention. The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. A system for collecting energy from a plurality of solar cells, the system comprising:
   an interconnect circuit comprising programmable circuit routes for selectively interconnecting a plurality of solar cells to a plurality of solar cell strings, wherein each solar cell string in the plurality of solar cell strings comprises a plurality of operable solar cells coupled in series;
   a control circuit, coupled to the interconnect circuit, and configured for:
     receiving output measurements for each one of the plurality of operable solar cells;
     selectively coupling, based on the output measurements and spatial positioning of the plurality of solar cells, through the programmable circuit routes, a first group of the plurality of solar cells to a first solar cell string in the plurality of solar cell strings, and wherein each solar cell of the first group of solar cells having a first specific output energy efficiency; and
     selectively coupling, based on the output measurements and spatial positioning of the plurality of solar cells, through the programmable circuit routes, a second group of the plurality of solar cells to a second solar cell string in the plurality of solar cell strings, and wherein each solar cell of the second group of solar cells having a second specific output energy efficiency, and wherein the second specific output energy efficiency is lower than the first specific output energy efficiency, and wherein the output measurements comprise a current and voltage (IV) characteristic, and wherein the plurality of solar cells are grouped based on an output efficiency of each solar cell, or grouped based on a distance between adjacent cells in the plurality of solar cells, or grouped based on geographical location;

a monitoring circuit, coupled to the interconnect circuit, and configured for monitoring one or more conditions at each one of the plurality of operable solar cells;

wherein the control circuit is further configured for dynamically re-configuring the plurality of operable solar cells based on the monitored one or more conditions;

wherein the control circuit receives monitoring information and sensor outputs for each individual solar cell or each solar cell string, and wherein measurement data, comprises any or all of a measured voltage, current, irradiance, humidity, or temperature, and wherein the control circuit further provides confirmation to the interconnect circuit to either dynamically exclude solar cells from each solar cell string or dynamically include solar cells to each solar cell string based on the conditions received from the monitoring circuit, and wherein the control circuit further removes one solar cell from one solar cell string in the plurality of solar cell strings when the energy loss from the solar cell exceeds a threshold value, and wherein the control circuit is configured to bypass the solar cell, when the control circuit determines that the current and voltage measurements are out of specification for the solar cell, and wherein the control circuit is connected to the programmable interconnect so that energy generated from the bypassed solar cell is collected onto a parallel bus, when the control circuit determines to bypass the solar cell, and wherein the control circuit reconfigures the interconnect circuit to remove or add solar cells to one of the solar cell strings so as to match the output voltage of the solar cell string with a change in the programmable voltage specification, and wherein the control circuit is further configured to group the plurality of solar cells based on geographical location, and wherein the control circuit is configured to group the plurality of solar cells with similar outputs in one geographical location.

2. The system as set forth in claim 1, wherein the output measurements for each of the plurality of solar cells comprises a voltage output-for each solar cells.

3. The system as set forth in claim 1, wherein the first group of the plurality of solar cells is selectively coupled to the first solar cell strings after selecting solar cells for the first solar cell string by matching a voltage specification.

4. The system as set forth in claim 3, wherein the voltage specification is programmable.

5. The system as set forth in claim 1, wherein the first group of solar cells is selectively coupled to the first solar cell string by selecting a specific solar cell for the first group of solar cells with similar output measurements.

* * * * *